United States Patent
Liu et al.

(10) Patent No.: US 12,035,581 B2
(45) Date of Patent: Jul. 9, 2024

(54) DISPLAY PANEL, METHOD FOR MANUFACTURING DISPLAY PANEL, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Tingliang Liu, Beijing (CN); Huijuan Yang, Beijing (CN); Yi Zhang, Beijing (CN); Sangwon Lee, Beijing (CN); Yu Wang, Beijing (CN); Lujiang Huangfu, Beijing (CN)

(73) Assignees: CHENGDU BOE OPTOELECTRONICS TECHNOLOGY CO., LTD., Sichuan (CN); BOE TECHNOLOGY GROUP CO., LTD., Beling (CN)

( * ) Notice: Subject to any disclaimer, the term of this patent is extended or adjusted under 35 U.S.C. 154(b) by 753 days.

(21) Appl. No.: 17/255,884

(22) PCT Filed: Nov. 21, 2019

(86) PCT No.: PCT/CN2019/119953
§ 371 (c)(1),
(2) Date: Dec. 23, 2020

(87) PCT Pub. No.: WO2021/097754
PCT Pub. Date: May 27, 2021

(65) Prior Publication Data
US 2021/0359075 A1    Nov. 18, 2021

(51) Int. Cl.
*H10K 59/131*    (2023.01)
*H10K 50/81*    (2023.01)
(Continued)

(52) U.S. Cl.
CPC ........... *H10K 59/131* (2023.02); *H10K 50/81* (2023.02); *H10K 50/813* (2023.02);
(Continued)

(58) Field of Classification Search
None
See application file for complete search history.

(56) References Cited

U.S. PATENT DOCUMENTS

2018/0233079 A1    8/2018    Choi
2018/0254304 A1*    9/2018    Hong ................... H10K 59/131
(Continued)

FOREIGN PATENT DOCUMENTS

CN    105552102 A    5/2016
CN    109786434 A    5/2019
(Continued)

OTHER PUBLICATIONS

EP OA corresponding to application No. 19945471.1 PCT/CN2019119953 dated Oct. 28, 2022, 10 pages.

*Primary Examiner* — William C Trapanese
(74) *Attorney, Agent, or Firm* — Muncy, Geissler, Olds & Lowe, P.C.

(57) ABSTRACT

A display panel, a method for manufacturing the display panel and a display device are provided. The display panel includes a base, a functional film layer, and a plurality of first light-emitting elements. The functional film layer includes a power source signal line layer, a data line layer and a compensation functional layer, the power source signal line layer includes a power source signal line pattern arranged at each subpixel region, the data line layer includes a data line pattern arranged at each subpixel region, and the compensation functional layer includes a compensation functional pattern arranged at at least one subpixel region. The first (Continued)

light-emitting element includes a first anode, a first light-emitting pattern and a first cathode sequentially laminated.

22 Claims, 20 Drawing Sheets

(51) Int. Cl.
*H10K 50/813* (2023.01)
*H10K 59/121* (2023.01)
*H10K 71/00* (2023.01)
*H10K 59/12* (2023.01)

(52) U.S. Cl.
CPC ......... *H10K 59/1216* (2023.02); *H10K 71/00* (2023.02); *H10K 59/1201* (2023.02)

(56) References Cited

U.S. PATENT DOCUMENTS

| | | |
|---|---|---|
| 2018/0342570 A1 | 11/2018 | Hong et al. |
| 2019/0064552 A1 | 2/2019 | Kim et al. |
| 2020/0168674 A1 | 5/2020 | Tan et al. |
| 2021/0233989 A1 | 7/2021 | Li et al. |

FOREIGN PATENT DOCUMENTS

| | | | |
|---|---|---|---|
| CN | 110137212 A | 8/2019 | |
| EP | 3370275 A1 | 9/2018 | |
| JP | 2018198198 A | 12/2018 | |

* cited by examiner

DISPLAY PANEL, METHOD FOR MANUFACTURING DISPLAY PANEL, AND DISPLAY DEVICE

CROSS-REFERENCE TO RELATED APPLICATION

The present application is the U.S. national phase of PCT Application No. PCT/CN2019/119953 filed on Nov. 21, 2019, the disclosure of which is incorporated herein by reference in its entirety.

TECHNICAL FIELD

The present disclosure relates to the field of display technology, in particular to a display panel, a method for manufacturing the display panel, and a display device.

BACKGROUND

Active-Matrix Organic Light-Emitting Diode (AMOLED) display product has been widely applied to various fields due to such advantages as high brightness, low power consumption, rapid response, high definition, excellent flexibility and high luminous efficiency.

Along with the application of the AMOLED display product in a wider range, the display quality of the AMOLED display product is highly demanded. During a displaying process of the display product, such a phenomenon as colorful pieces may easily occur for the display product.

SUMMARY

An object of the present disclosure is to provide a display panel, a method for manufacturing the display panel and a display device.

In one aspect, the present disclosure provides in some embodiments a display panel, including a base, a functional film layer arranged on the base, a plurality of first light-emitting elements arranged at a side of the functional film layer distal to the base, and a plurality of subpixel regions arranged in an array form. The functional film layer includes a power source signal line layer, a data line layer and a compensation functional layer, the power source signal line layer includes a power source signal line pattern arranged at each subpixel region, the data line layer includes a data line pattern arranged at each subpixel region, the power source signal line pattern includes a first portion extending in a first direction, the data line pattern extends in the first direction, and the compensation functional layer includes a compensation functional pattern arranged at at least one subpixel region. Each first light-emitting element includes a first anode, a first light-emitting pattern and a first cathode sequentially laminated in a direction away from the base. An orthogonal projection of the first anode onto the base overlaps an orthogonal projection of a corresponding power source signal line pattern onto the base at a first overlapping region, overlaps an orthogonal projection of a corresponding data line pattern onto the base at a second overlapping region, and overlaps an orthogonal projection of a corresponding compensation functional pattern onto the base at a third overlapping region. The second overlapping region is arranged between the first overlapping region and the third overlapping region.

In a possible embodiment of the present disclosure, the first anode includes a first edge portion and a second edge portion arranged opposite to each other in a second direction crossing the first direction, and a first intermediate portion arranged between the first edge portion and the second edge portion. An orthogonal projection of the first edge portion onto the base includes the first overlapping region, an orthogonal projection of the second edge portion onto the base includes the third overlapping region, and an orthogonal projection of the first intermediate portion onto the base includes the second overlapping region.

In a possible embodiment of the present disclosure, the orthogonal projection of the first edge portion onto the base does not overlap an orthogonal projection of the first light-emitting pattern onto the base, the orthogonal projection of the second edge portion onto the base does not overlap the orthogonal projection of the first light-emitting pattern onto the base, and the orthogonal projection of the first intermediate portion onto the base overlaps the orthogonal projection of the first light-emitting pattern onto the base.

In a possible embodiment of the present disclosure, the functional film layer further include a gate scanning line layer, an initialization signal line layer, a resetting signal line layer and a light-emission control signal line layer. The gate scanning line layer includes a gate scanning line pattern arranged at each subpixel region, the initialization signal line layer includes an initialization signal line pattern arranged at each subpixel region, the resetting signal line layer includes a resetting signal line pattern arranged at each subpixel region, the light-emission control signal line layer includes a light-emission control signal line pattern arranged at each subpixel region, and the gate scanning line pattern, the initialization signal line pattern, the resetting signal line pattern and the light-emission control signal line pattern extend in a second direction crossing the first direction.

In a possible embodiment of the present disclosure, the first anode further includes a third edge portion and a fourth edge portion arranged opposite to each other in the first direction, the first intermediate portion is arranged between the third edge portion and the fourth edge portion, the third edge portion is coupled to the first edge portion and the second edge portion, the fourth edge portion is coupled to the first edge portion and the second edge portion, and the orthogonal projection of the first intermediate portion onto the base overlaps an orthogonal projection of a corresponding gate scanning line pattern onto the base and an orthogonal projection of a corresponding resetting signal line pattern onto the base at a sixth overlapping region.

In a possible embodiment of the present disclosure, the first anode includes a body portion and a via-hole connection portion, the body portion includes the first edge portion, the second edge portion, the third edge portion, the fourth edge portion and the first intermediate portion, and the body portion is a centrosymmetric pattern.

In a possible embodiment of the present disclosure, the first intermediate portion is a centrosymmetric pattern, and the orthogonal projection of the first intermediate portion onto the base coincides with the orthogonal projection of the first light-emitting pattern onto the base.

In a possible embodiment of the present disclosure, the display panel includes a first metal layer, a second metal layer and a third metal layer. The gate scanning line layer, the resetting signal line layer and the light-emission control signal line layer are arranged in the first metal layer, the initialization signal line layer is arranged in the second metal layer, and the data line layer, the power source signal line layer and the compensation functional layer are arranged in the third metal layer. The functional film layer further includes a first insulation layer and a second insulation layer, the first insulation layer is arranged between the first metal layer and the second metal layer, and the second insulation layer is arranged between the second metal layer and the third metal layer.

In a possible embodiment of the present disclosure, the compensation functional pattern is made of a conductive material and coupled to the initialization signal line pattern.

In a possible embodiment of the present disclosure, the compensation functional pattern and the data line pattern are arranged in a same layer.

In a possible embodiment of the present disclosure, the display panel further includes a plurality of subpixel driving circuitries, a first part of the subpixel driving circuitries correspond to the first light-emitting elements respectively and each of the first part of the subpixel driving circuitries is configured to drive a respective first light-emitting element to emit light. Each subpixel driving circuitry includes a driving transistor, a first transistor, a second transistor, a fourth transistor and a storage capacitor. A gate electrode of the first transistor is coupled to a corresponding gate scanning line pattern, a first electrode of the first transistor is coupled to a second electrode of the driving transistor, and a second electrode of the first transistor is coupled to a gate electrode of the driving transistor. A gate electrode of the second transistor is coupled to a corresponding resetting signal line pattern, a first electrode of the second transistor is coupled to a corresponding initialization signal line pattern, and a second electrode of the second transistor is coupled to the gate electrode of the driving transistor. A gate electrode of the fourth transistor is coupled to the corresponding gate scanning line pattern, a first electrode of the fourth transistor is coupled to a corresponding data line pattern, and a second electrode of the fourth transistor is coupled to a first electrode of the driving transistor. The first electrode of the driving transistor is coupled to a corresponding power source signal line pattern, and the second electrode of the driving transistor is coupled to a corresponding first light-emitting element. A first electrode plate of the storage capacitor is coupled to the gate electrode of the driving transistor, and a second electrode plate of the storage capacitor is coupled to the corresponding power source signal line pattern.

In a possible embodiment of the present disclosure, the subpixel driving circuitry further includes a first conductive connection member through which the second electrode of the first transistor is coupled to the gate electrode of the driving transistor. The display panel further includes a third metal layer, the first conductive connection member is arranged at the third metal layer, and an orthogonal projection of the first conductive connection member in each of the first part of the subpixel driving circuitries onto the base does not overlap the orthogonal projection of the corresponding first anode onto the base.

In a possible embodiment of the present disclosure, the display panel further includes a plurality of second light-emitting elements and a plurality of third light-emitting elements. Each second light-emitting element includes a second anode, a second light-emitting pattern and a second cathode sequentially laminated in the direction away from the base, each third light-emitting element includes two light-emitting sub-elements arranged opposite to each other in the first direction, and each light-emitting sub-element includes a third anode, a third light-emitting pattern and a third cathode sequentially laminated in the direction away from the base. The plurality of subpixel driving circuitries further includes a second part of the subpixel driving circuitries and a third part of the subpixel driving circuitries, the second part of the subpixel driving circuitries correspond to the second light-emitting elements respectively, each of the second part of the subpixel driving circuitries is configured to drive a corresponding second light-emitting element to emit light, the third part of the subpixel driving circuitries correspond to the light-emitting sub-elements respectively, and each of the third part of the subpixel driving circuitries is configured to drive a corresponding light-emitting sub-element to emit light. The orthogonal projection of the first conductive connection member in each of the second part of the subpixel driving circuitries onto the base overlaps an orthogonal projection of a corresponding second anode onto the base, and the orthogonal projection of the first conductive connection member in each of the third part of the subpixel driving circuitries onto the base overlaps an orthogonal projection of a corresponding third anode onto the base.

In a possible embodiment of the present disclosure, the gate electrode of the first transistor is in direct contact with the corresponding gate scanning line pattern.

In a possible embodiment of the present disclosure, an orthogonal projection of the first electrode of the first transistor onto the base does not overlap an orthogonal projection of a corresponding compensation functional pattern onto the base.

In a possible embodiment of the present disclosure, an orthogonal projection of the second electrode of the first transistor onto the base does not overlap the orthogonal projection of the corresponding compensation functional pattern onto the base.

In a possible embodiment of the present disclosure, each subpixel driving circuitry further includes a seventh transistor, a gate electrode of the seventh transistor is coupled to the resetting signal line pattern, a second electrode of the seventh transistor in each of the first part of the subpixel driving circuitries is coupled to the first anode, an orthogonal projection of the first electrode of the seventh transistor onto the base overlaps the orthogonal projection of the corresponding compensation functional pattern onto the base at a seventh overlapping region, and the first electrode of the seventh transistor is coupled to the corresponding compensating functional pattern through a via-hole in the seventh overlapping region and indirectly coupled to a corresponding initialization signal line pattern through the compensation functional pattern.

In a possible embodiment of the present disclosure, an orthogonal projection of the gate electrode of the driving transistor onto the base at least partially overlaps the orthogonal projection of the corresponding compensation functional pattern onto the base.

In a possible embodiment of the present disclosure, the orthogonal projection of the gate electrode of the driving transistor onto the base overlaps the orthogonal projection of the corresponding compensation functional pattern onto the base to form a first overlapping portion, and an orthogonal projection of the first overlapping portion onto the base at least partially overlaps the orthogonal projection of the corresponding first anode onto the base.

In a possible embodiment of the present disclosure, the first electrode plate of the storage capacitor is made of a same material as the gate scanning line pattern and the resetting signal line pattern, and the second electrode plate of the storage capacitor is made of a same material as the initialization signal line pattern. An orthogonal projection of the first electrode plate of the storage capacitor onto the base and an orthogonal projection of the second electrode plate of the storage capacitor onto the base are each arranged between an orthogonal projection of the corresponding gate scanning line pattern onto the base and an orthogonal projection of the corresponding light-emission control signal line pattern onto the base.

In a possible embodiment of the present disclosure, the functional film layer further includes a gate insulation layer and a first insulation layer arranged at a side of the gate insulation layer distal to the base, the first electrode plate of the storage capacitor, the gate scanning line pattern and the resetting signal line pattern are each arranged at a surface of the gate insulation layer distal to the base, and the second electrode plate of the storage capacitor and the initialization signal line pattern are each arranged at a surface of the first insulation layer distal to the base.

In a possible embodiment of the present disclosure, each of the orthogonal projection of the first electrode plate of the storage capacitor onto the base and the orthogonal projection of the second electrode plate of the storage capacitor onto the base partially overlaps the orthogonal projection of the corresponding first anode onto the base.

In a possible embodiment of the present disclosure, each of the orthogonal projection of the first electrode plate of the storage capacitor onto the base and the orthogonal projection of the second electrode plate of the storage capacitor onto the base partially overlaps the orthogonal projection of the corresponding compensation functional pattern onto the base.

In a possible embodiment of the present disclosure, the second electrode plate of the storage capacitor is provided with an opening at a central region, and an orthogonal projection of the opening onto the base does not overlap the orthogonal projection of the corresponding compensation functional pattern onto the base.

In a possible embodiment of the present disclosure, in a direction perpendicular to the base, a difference between a thickness of the compensation functional layer and a thickness of the power source signal line layer is within a threshold range, or a difference between the thickness of the compensation functional layer and a thickness of the data line layer is within a threshold range.

In a possible embodiment of the present disclosure, the display panel further includes a plurality of second light-emitting elements, each second light-emitting element includes a second anode, a second light-emitting pattern and a second cathode sequentially laminated in the direction away from the base, the second anode includes a fifth edge portion, a sixth edge portion arranged opposite to the fifth edge portion in the second direction, and a second intermediate portion arranged between the fifth edge portion and the sixth edge portion, and an orthogonal projection of the second intermediate portion onto the base coincides with an orthogonal projection of the second light-emitting pattern onto the base. The orthogonal projection of the second intermediate portion onto the base at least partially overlaps the orthogonal projection of the corresponding power source signal line pattern onto the base, and at least partially overlaps the orthogonal projection of the corresponding data line pattern onto the base.

In a possible embodiment of the present disclosure, the second light-emitting pattern is symmetric relative to a second symmetry axis extending in the first direction, and an orthogonal projection of the second symmetry axis onto the base is located within the orthogonal projection of the corresponding power source signal line pattern onto the base.

In a possible embodiment of the present disclosure, the display panel further includes a plurality of third light-emitting elements, each third light-emitting element includes two light-emitting sub-elements arranged opposite to each other in the first direction, each light-emitting sub-element includes a third anode, a third light-emitting pattern and a third cathode sequentially laminated in the direction away from the base, the third anode includes a seventh edge portion, an eighth edge portion arranged opposite to the seventh edge portion in the second direction, and a third intermediate portion arranged between the seventh edge portion and the eighth edge portion, and an orthogonal projection of the third intermediate portion onto the base coincides with an orthogonal projection of the third light-emitting pattern onto the base. The orthogonal projection of the third intermediate portion onto the base at least partially overlaps the orthogonal projection of the corresponding data line pattern onto the base, and an orthogonal projection of the seventh edge portion onto the base at least partially overlaps the orthogonal projection of the corresponding power source signal line pattern onto the base.

In a possible embodiment of the present disclosure, the first light-emitting element includes a red subpixel, the second light-emitting element includes a blue subpixel, and the third light-emitting element includes a green subpixel.

In another aspect, based on the technical solution of the display panel, the present disclosure provides in some embodiments a display device including the above-mentioned display panel.

In yet another aspect, based on the technical solution of the display panel, the present disclosure provides in some embodiments a method for manufacturing a display panel including a plurality of subpixel regions arranged in an array form. The method includes: forming a functional film layer on a base, the functional film layer including a power source signal line layer, a data line layer and a compensation functional layer, the power source signal line layer including a power source signal line pattern arranged at each subpixel region, the data line layer including a data line pattern arranged at each subpixel region, the power source signal line pattern including a first portion extending in a first direction, each data line pattern extending in the first direction, and the compensation functional layer including a compensation functional pattern arranged at at least one subpixel region; and forming a plurality of first light-emitting elements at a side of the functional film layer distal to the base, each first light-emitting element including a first anode, a first light-emitting pattern and a first cathode sequentially laminated in a direction away from the base. An orthogonal projection of the first anode onto the base overlaps an orthogonal projection of a corresponding power source signal line pattern onto the base at a first overlapping region, overlaps an orthogonal projection of a corresponding data line pattern onto the base at a second overlapping region, and overlaps an orthogonal projection of a corresponding compensation functional pattern onto the base at a third overlapping region. The second overlapping region is arranged between the first overlapping region and the third overlapping region.

BRIEF DESCRIPTION OF THE DRAWINGS

The following drawings are provided to facilitate the understanding of the present disclosure, and constitute a portion of the description. The embodiments and the explanations thereof in the present disclosure are for illustrative purposes only, but shall not be construed as limiting the present disclosure. In these drawings.

DETAILED DESCRIPTION

In order to further describe the display panel, the method for manufacturing the display panel, and the display device in the embodiments of the present disclosure, the present disclosure will be described hereinafter in conjunction with the drawings and embodiments.

An AMOLED display panel includes a base, a plurality of subpixel driving circuitries arranged on the base, and a plurality of light-emitting elements arranged at a side of the subpixel driving circuitries distal to the base and corresponding to the subpixel driving circuitries respectively. The subpixel driving circuitry is configured to drive a corresponding light-emitting element to emit light, so as to achieve a display function of the display panel.

Figure 1:
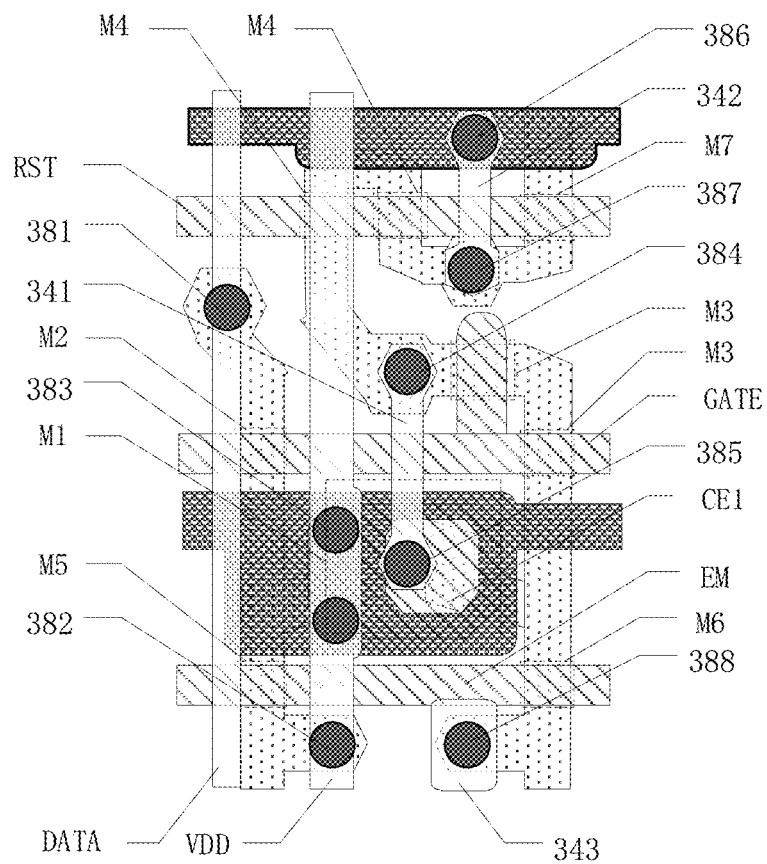
FIG. 1 is an arrangement schematic view showing a subpixel driving circuitry in related art.
Figure 2:
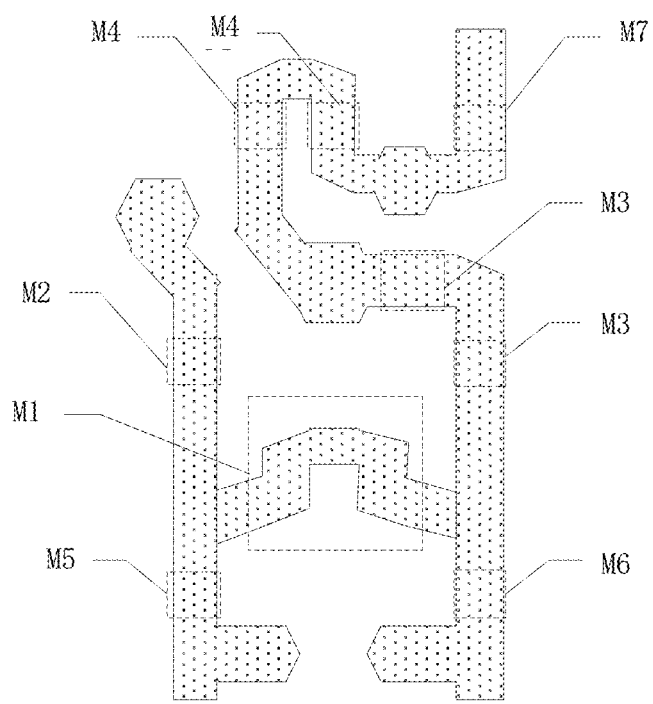
FIGS. 2-5 are structure schematic views showing film layers of the subpixel driving circuitry in related art.
Figure 3:
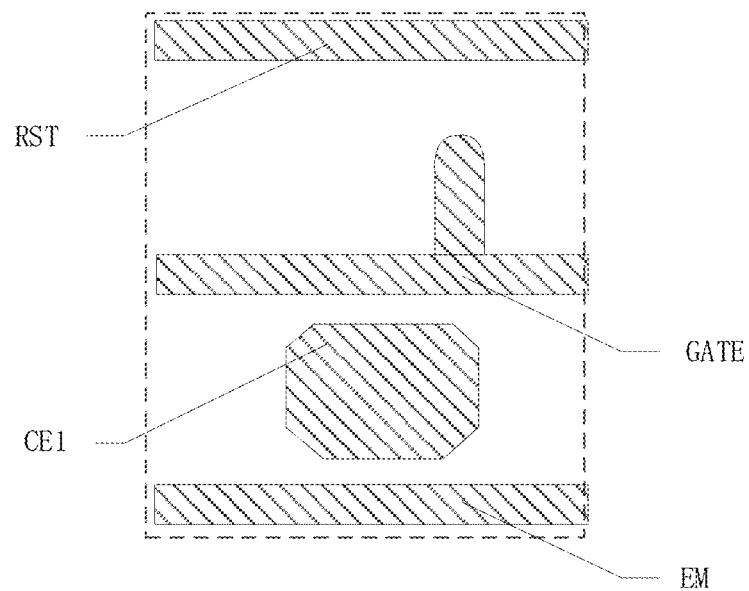
Figure 4:
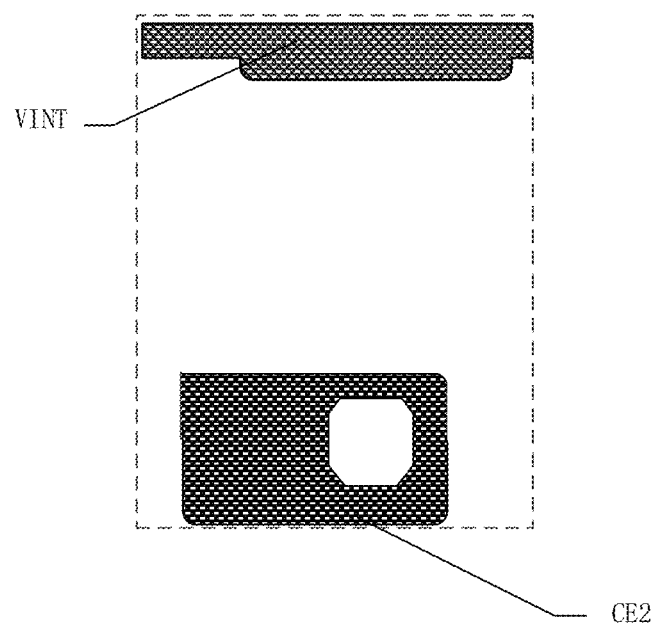
Figure 5:
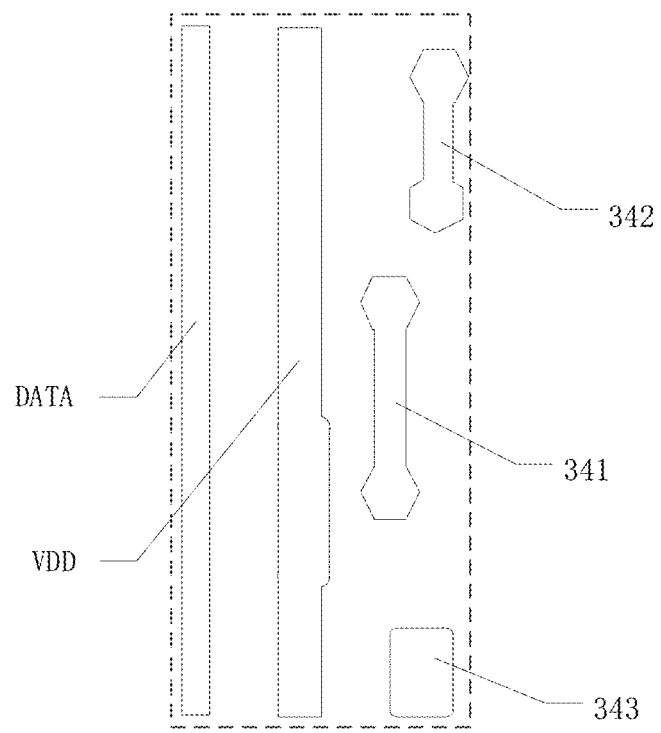

In the related art, usually each subpixel driving circuitry includes a plurality of Thin Film Transistors (TFTs). When the subpixel driving circuitry includes seven TFTs, e.g., M1 to M7, FIG. 1 shows the arrangement of the seven TFTs. In this arrangement, the subpixel driving circuitry includes an active layer as shown in FIG. 2, a first metal layer as shown in FIG. 3, a second metal layer as shown in FIG. 4, and a third metal layer as shown in FIG. 5. The active layer includes an active pattern for forming a channel region of each TFT (e.g., a portion in a dotted box in FIG. 2), and a conductive doped active pattern coupled to the active pattern (e.g., a portion beyond the dotted box in FIG. 2). The first metal layer includes a gate electrode of each TFT, a scanning signal line pattern GATE coupled to the gate electrode, an electrode plate CE1 of a storage capacitor in the subpixel driving circuitry, a resetting signal line pattern RST, and a light-emission control signal line pattern EM. The second metal layer includes an initialization signal line pattern VINT and another electrode plate CE2 of the storage capacitor in the subpixel driving circuitry. The third metal layer includes a data line pattern DATA, a power source signal line pattern VDD, and some conductive connection portions (e.g., 341 to 343).

It should be appreciated that, as shown in FIG. 1, when forming the subpixel driving circuitry, some via-holes (e.g., 381 to 388) are provided so as to enable the functional patterns at different layers to be coupled to each other.

Figure 6:
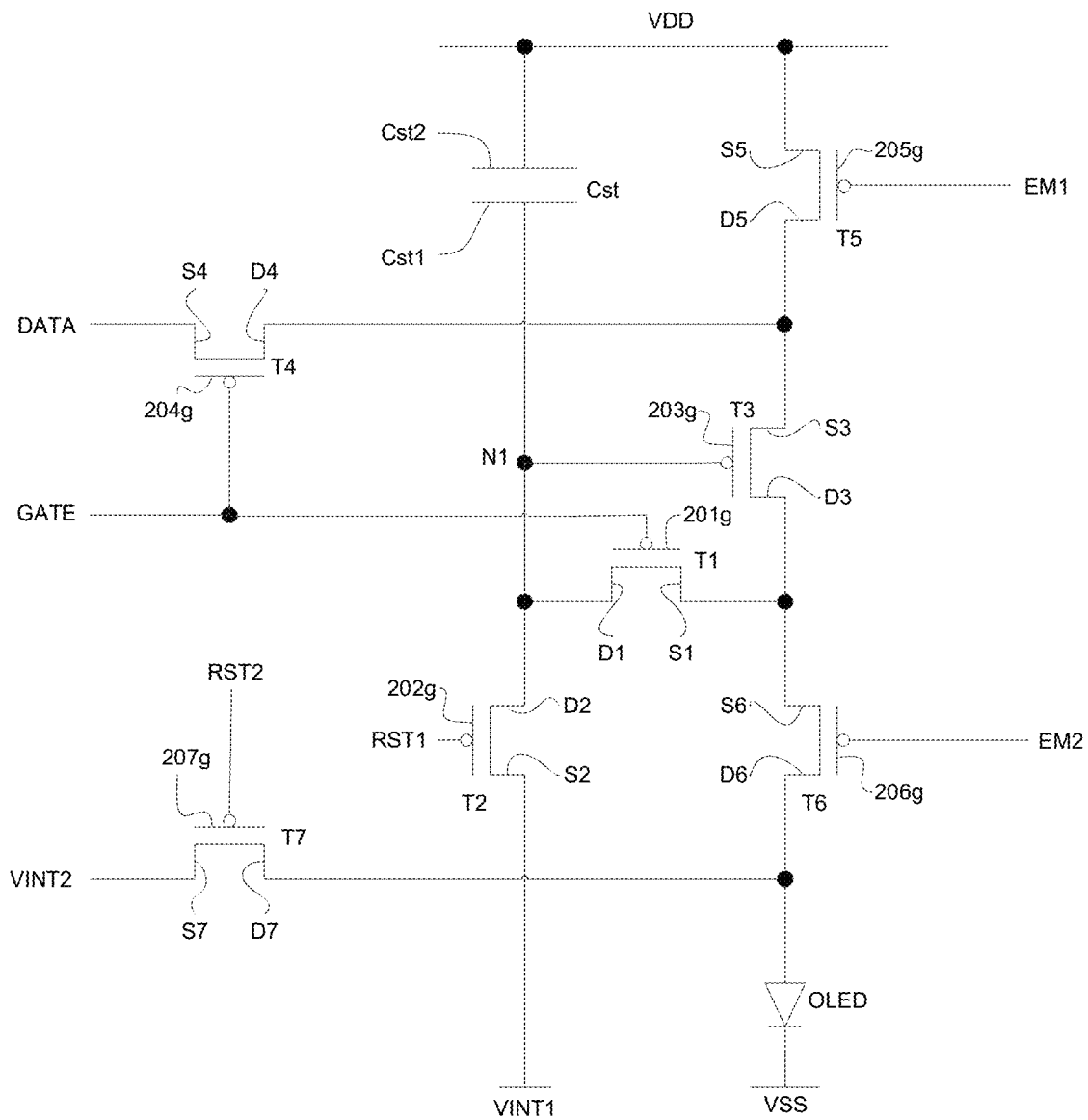
FIG. 6 is a first structure schematic view showing a subpixel driving circuitry according to an embodiment of the present disclosure.
Figure 7:
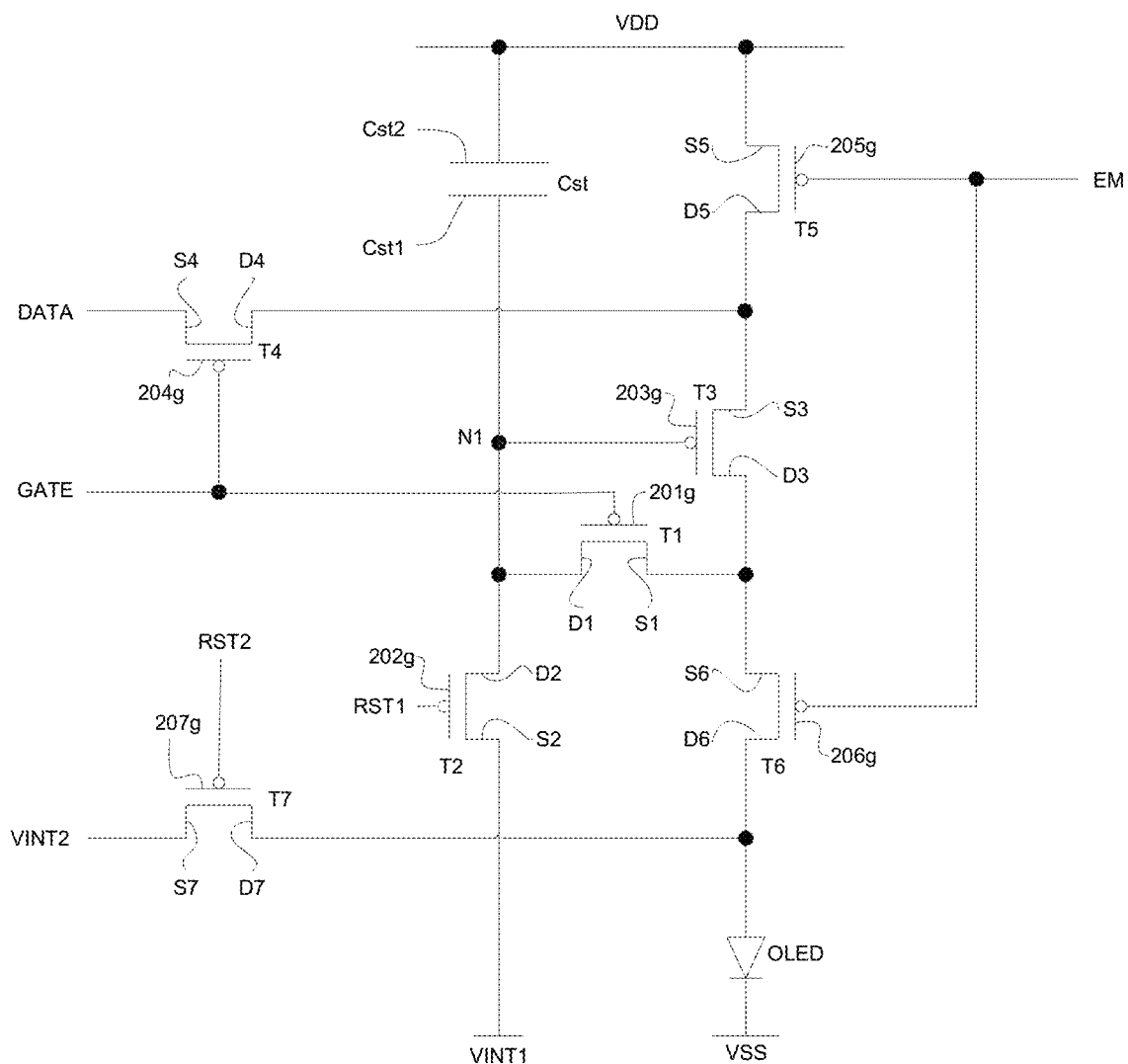
FIG. 7 is a second structure schematic view showing the subpixel driving circuitry according to an embodiment of the present disclosure.

As shown in FIGS. 6 and 7, the present disclosure provides in some embodiments a display panel including a plurality of subpixel driving circuitries. Illustratively, each subpixel driving circuitry may include seven TFTs and one capacitor. The display panel may further include initialization signal line patterns VINT, gate scanning line patterns GATE, light-emission control signal line patterns EM, resetting control signal line patterns RST, data line patterns DATA and power source signal line patterns VDD which are arranged at subpixel regions of the display panel respectively.

The plurality of subpixel driving circuitries may be arranged in an array form and arranged in the subpixel regions of the display panel respectively. The plurality of subpixel driving circuitries may be arranged in rows and columns. The initialization signal line patterns VINT corresponding to the subpixel driving circuitries in a same row may be electrically connected to one another to form an integral structure; the gate scanning line patterns GATE corresponding to the subpixel driving circuitries in a same row may be electrically connected to one another to form an integral structure; the light-emission control signal line patterns EM corresponding to the subpixel driving circuitries in a same row may be electrically connected to one another to form an integral structure; the resetting control signal line patterns RST corresponding to the subpixel driving circuitries in a same row may be electrically connected to one another to form an integral structure; the data line patterns DATA corresponding to the subpixel driving circuitries in a same column may be electrically connected to one another to form an integral structure; and the power source signal line patterns VDD corresponding to the subpixel driving circuitries in a same column may be electrically connected to one another to form an integral structure.

Illustratively, the subpixel driving circuitries in each row may include a plurality of subpixel driving circuitries arranges sequentially in a direction X, and the initialization signal line pattern VINT, the gate scanning line pattern GATE, the light-emission control signal line pattern EM and the resetting control signal line pattern RST may each extend in the direction X. Each of the subpixel driving circuitries in each row may be coupled to the corresponding initialization signal line pattern VINT, the corresponding gate scanning line pattern GATE, the corresponding light-emission control signal line pattern EM and the corresponding resetting control signal line pattern RST. The subpixel driving circuitries in each column may include a plurality of subpixel driving circuitries arranges sequentially in a direction Y, and the data line pattern DATA and the power source signal line pattern VDD may each extend in the direction Y. Each of the subpixel driving circuitries in each column may be coupled to the corresponding data line pattern DATA and the power source signal line pattern VDD.

As shown in FIG. 6, each subpixel driving circuitry of the display panel may include a first transistor T1, a second transistor T2, a third transistor T3, a fourth transistor T4, a fifth transistor T5, a sixth transistor T6, a seventh transistor T7 and a storage capacitor Cst. The first transistor T1, the second transistor T2, the third transistor T3, the fourth transistor T4, the fifth transistor T5, the sixth transistor T6 and the seventh transistor T7 may each be a P-type transistor.

The first transistor T1 may be of a double-gate structure. A gate electrode 201*g* of the first transistor T1 may be coupled to the corresponding gate scanning line pattern GATE, a source electrode S1 thereof may be coupled to a drain electrode D3 of the third transistor T3, and a drain electrode D1 thereof may be coupled to a gate electrode 203*g* of the third transistor T3.

The second transistor T2 may be of a double-gate structure. A gate electrode 202*g* of the second transistor T2 may be coupled to the corresponding resetting signal line pattern RST1, a source electrode S2 thereof may be coupled to a corresponding first initialization signal line pattern VINT1, and a drain electrode D2 thereof may be coupled to the gate electrode 203*g* of the third transistor T3.

A gate electrode 204*g* of the fourth transistor T4 may be coupled to the corresponding gate scanning line pattern GATE, a source electrode S4 thereof may be coupled to the corresponding data line pattern DATA, and a drain electrode D4 thereof may be coupled to a source electrode S3 of the third transistor T3.

A gate electrode 205*g* of the fifth transistor T5 may be coupled to a corresponding first light-emission control signal line pattern EM1, a source electrode S5 thereof may be coupled to the corresponding power source signal line pattern VDD, and a drain electrode D5 thereof may be coupled to the source electrode S3 of the third transistor T3.

A gate electrode 206*g* of the sixth transistor T6 may be coupled to a corresponding second light-emission control signal line pattern EM2, a source electrodes S6 of the sixth transistor T6 may be coupled to a drain electrode D3 of the third transistor T3, and a drain electrode D6 thereof may be coupled to a first anode 501 of an Organic Light-Emitting Diode (OLED).

A gate electrode 207*g* of the seventh transistor T7 may be coupled to a second resetting signal line pattern RST2, a drain electrode D7 thereof may be coupled to the first anode 501 of the OLED, and a source electrode S7 thereof may be coupled to a corresponding second initialization signal line pattern VINT2.

A first electrode plate Cst1 of the storage capacitor Cst may be coupled to the gate electrode 203*g* of the third transistor T3, so the gate electrode 203*g* of the third transistor T3 may be directly reused as the first electrode plate Cst1 of the storage capacitor Cst. A second electrode Cst2 of the storage capacitor Cst may be coupled to the corresponding power source signal line pattern VDD.

As shown in FIG. 7, the first light-emission control signal line pattern EM1 and the second light-emission control signal line pattern EM2 may share a same light-emission control signal pattern EM, so it is able to control on and off states of the fifth transistor T5 and the sixth transistor T6 through the light-emission control signal line pattern simultaneously.

Figure 8:
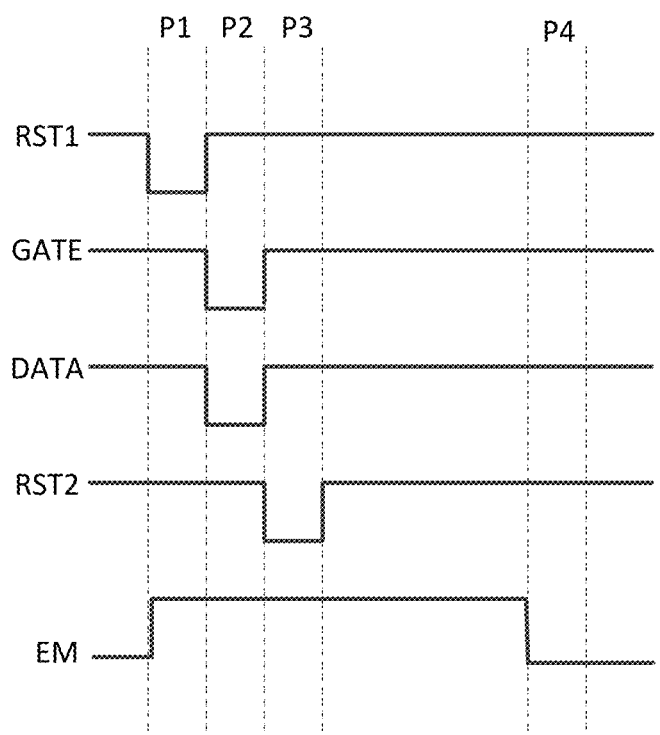
FIG. 8 is a sequence diagram of the subpixel driving circuitry according to an embodiment of the present disclosure.

As shown in FIG. 8, during the operation of the subpixel driving circuitry in FIG. 7, each working period may include a first resetting time period P1, a write-in compensation time period P2, a second resetting time period P3 and a light-emission time period P4.

Within the first resetting time period P1, a first resetting signal inputted to the first resetting signal line pattern RST1 may be at an active level so as to turn on the second transistor T2. An initialization signal may be inputted by the first initialization signal line pattern VINT1 to the gate electrode 203*g* of the third transistor T3, so as to clear a gate-to-source voltage Vgs maintained on the third transistor T3 within a previous frame to zero, thereby to reset the gate electrode 203*g* of the third transistor T3.

Within the write-in compensation time period P2, the first resetting signal may be at an inactive level, so as to turn off the second transistor T2. A gate scanning signal inputted to the gate scanning line pattern GATE may be at an active level, so as to turn on the first transistor T1 and the fourth transistor T4. A data signal may be written into the data line pattern DATA and transmitted via the fourth transistor T4 to the source electrode S3 of the third transistor T3. In addition, the first transistor T1 and the fourth transistor T4 may be turned on, so as to enable the third transistor T3 to serve as a diode. Hence, through the cooperation of the first transistor T1, the third transistor T3 and the fourth transistor T4, it is able to compensate for a threshold voltage of the third transistor T3. When a compensation time period is sufficiently long, it is able to control a potential at the gate electrode 203*g* of the third transistor T3 to finally reach Vdata+Vth, where Vdata represents the data signal, and Vth represents the threshold voltage of the third transistor T3.

Within the second resetting time period P3, the gate scanning signal may be at an inactive level, so as to turn off the first transistor T1 and the fourth transistor T4. A second resetting signal inputted by the second resetting signal line pattern RST2 may be at an active level, so as to turn on the seventh transistor T7. The first initialization signal may be inputted by the first initialization signal line pattern VINT1 to the anode of the OLED, so as to control the OLED not to emit light.

Within the light-emission time period P4, a light-emission control signal written by the light-emission control signal line pattern EM may be at an active level, so as to turn on the fifth transistor T5 and the sixth transistor T6, thereby to input a power source signal from the power source signal line pattern VDD to the source electrode S3 of the third transistor T3. In addition, the gate electrode 203*g* of the third transistor T3 may be maintained at Vdata+Vth, so the third transistor T3 may be turned on, and the gate-to-source voltage of the third transistor T3 maybe Vdata+Vth−Vdd, where Vdd represents a potential corresponding to the power source signal. A leakage current generated due to the gate-to-source voltage may flow to the anode of the corresponding OLED, so as to drive the corresponding OLED to emit light.

Figure 9:
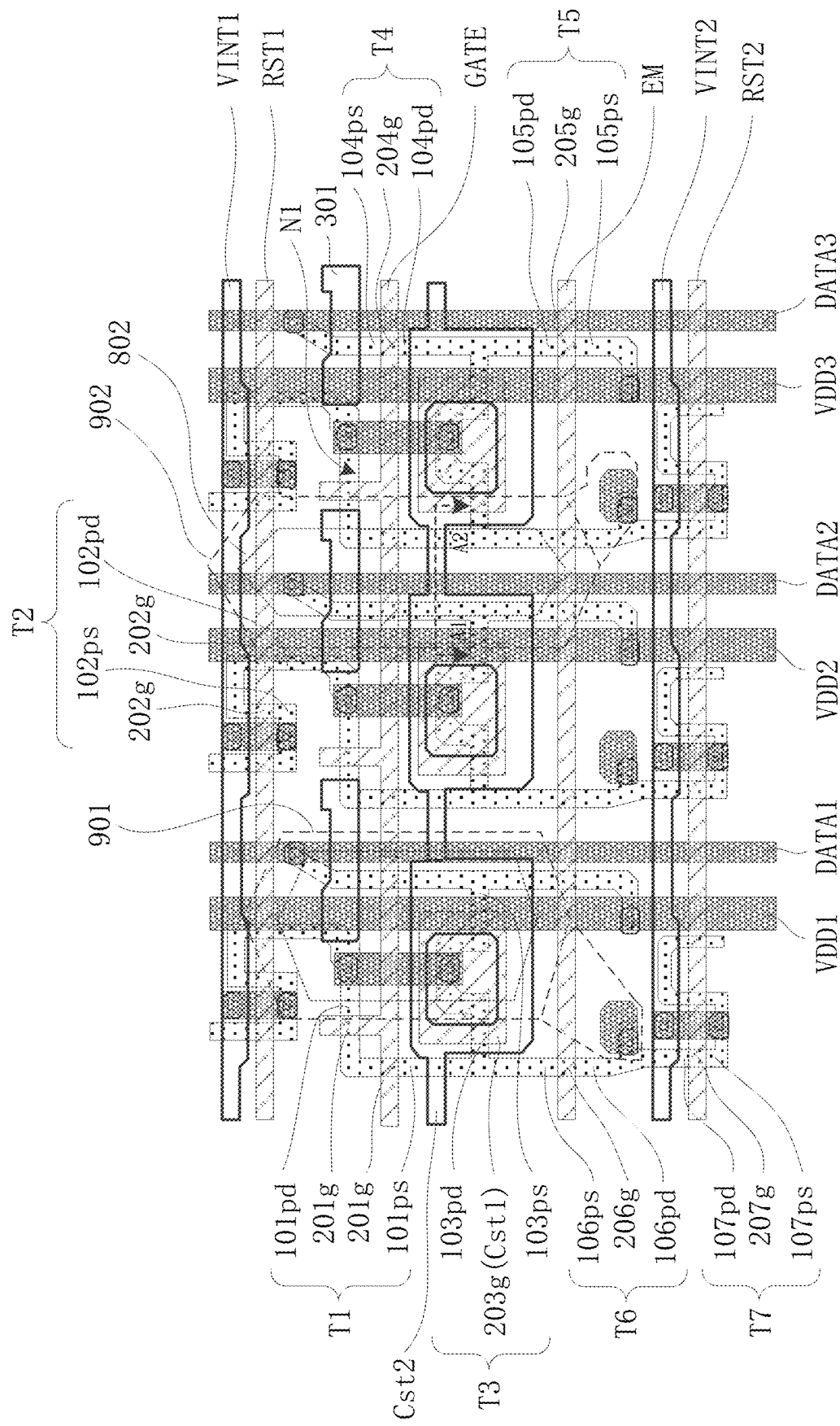
FIG. 9 is a first arrangement schematic view showing the subpixel driving circuitry in a display panel according to an embodiment of the present disclosure.
Figure 10:
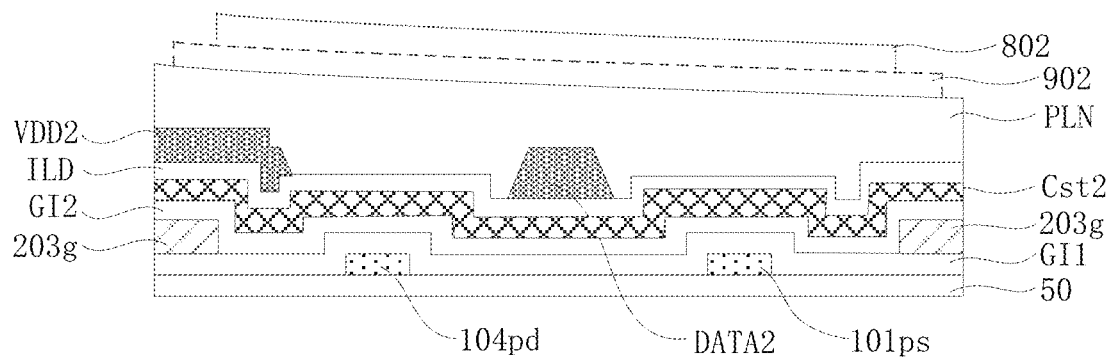
FIG. 10 is a sectional view along a line A1A2 in FIG. 9.

FIG. 9 shows the layout of three adjacent subpixel driving circuitries. As shown in FIG. 9 and FIG. 10, during the manufacture of the subpixel driving circuitry, film layers of each subpixel driving circuitry may include an active layer (usually a low-temperature polysilicon layer), a gate insulation layer GI1, a first gate metal layer, a first interlayer insulation layer GI2, a second gate metal layer, a second interlayer insulation layer ILD, a first source/drain metal layer and a planarization layer PLN laminated one on another in a direction away from a base 70.

Figure 11:
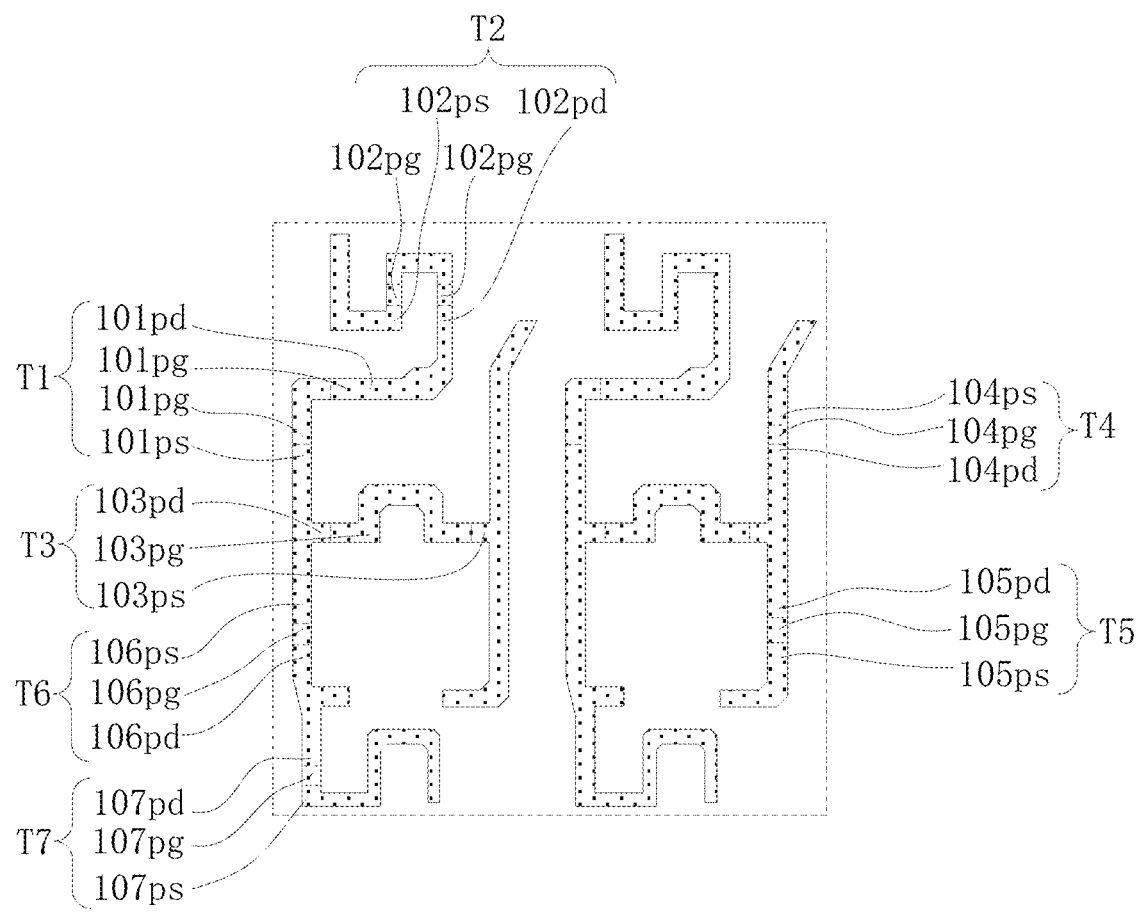
FIG. 11 is an arrangement schematic view showing an active layer according to an embodiment of the present disclosure.

As shown in FIG. 11, the active layer may be used to form a channel region (e.g., 101*pg* to 107*pg*), a source electrode formation region (e.g., 101*ps* to 107*ps*) and a drain electrode formation region (e.g., 101*pd* to 107*pd*) of each transistor in the subpixel driving circuitry. Due to a doping effect, a portion of the active layer corresponding to the source electrode formation region and the drain electrode formation region may have better conductivity than a portion of the active layer corresponding to the channel region. The portion of the active layer corresponding to the source electrode formation region may serve as source electrodes (e.g., S1 to S7) of the transistors, and the portion of the active layer corresponding to the drain electrode formation region may serve as drain electrodes (e.g., D1 to D7) of the transistors.

Figure 12:
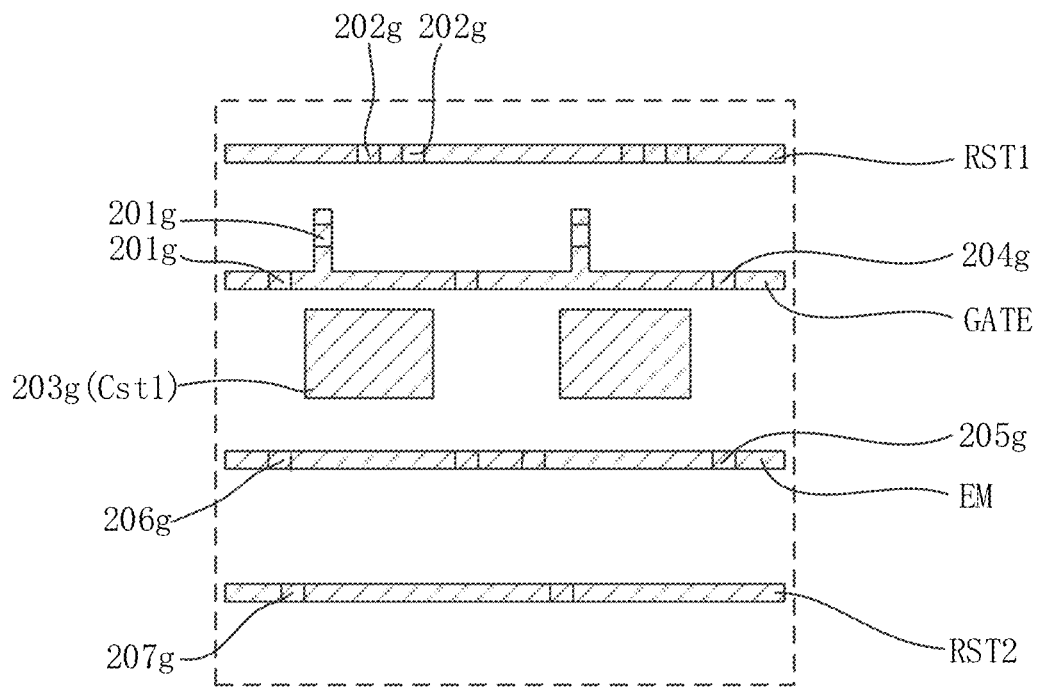
FIG. 12 is an arrangement schematic view showing a first gate metal layer according to an embodiment of the present disclosure.

As shown in FIG. 12, the first gate metal layer may be used to form the gate electrodes (e.g., 201*g* to 207*g*) of the transistors in the subpixel driving circuitries, the gate scanning signal line patterns GATE, the light-emission control signal line patterns EM, the first resetting signal line pattern RST1 and the second resetting signal line pattern RST2 included in the display panel. The gate electrode 203*g* of the third transistor T3 in each subpixel driving circuitry may be reused as the first electrode plate Cst1 of the storage capacitor Cst in the subpixel driving circuitry.

Figure 13:
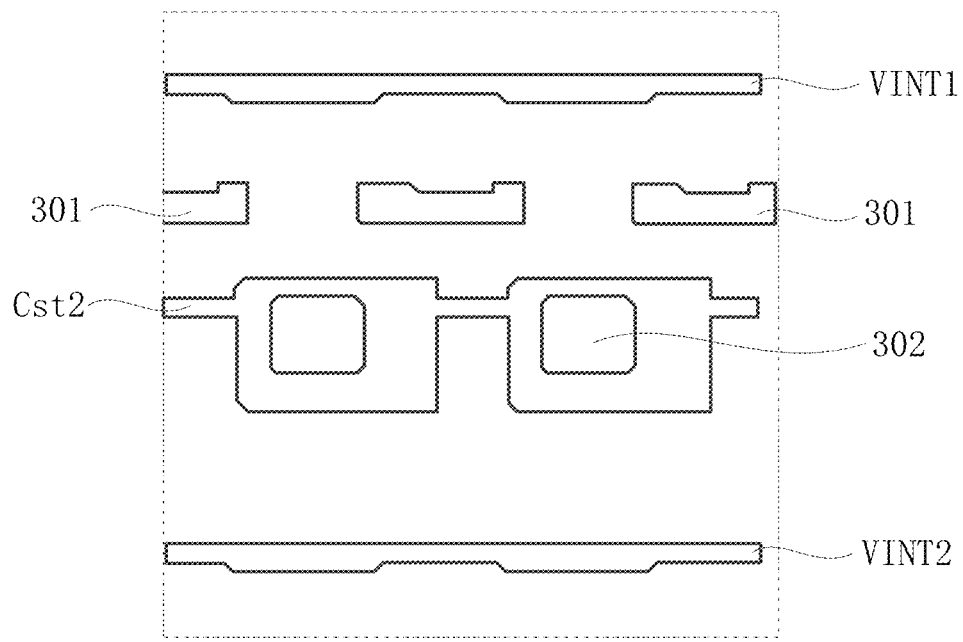
FIG. 13 is an arrangement schematic view showing a second gate metal layer according to an embodiment of the present disclosure.

As shown in FIG. 13, the second gate metal layer may be used to form the second electrode plate Cst2 of the storage capacitor Cst, a shielding pattern 301 (for shielding the active layer between two channel regions of the first transistor T1), and the first initialization signal line pattern VINT1 and the second initialization signal line pattern VINT2 of the display panel.

Figure 14:
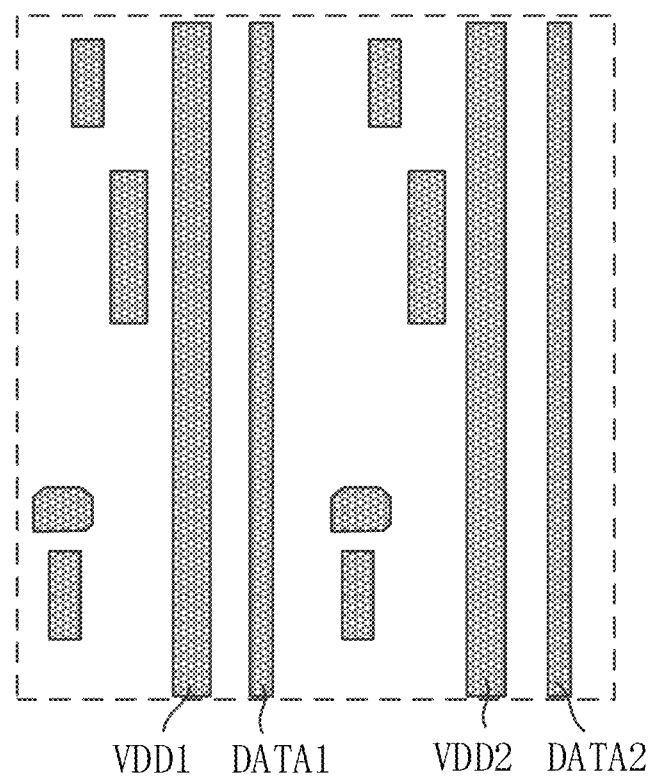
FIG. 14 is a first arrangement schematic view showing a source/drain metal layer according to an embodiment of the present disclosure.

As shown in FIGS. 9 and 14, the first source/drain metal layer may be used to form the data line patterns (e.g., DATA1, DATA2 and DATA3) and the power source signal line patterns (e.g., VDD1, VDD2 and VDD3) of the display panel.

More specifically, referring to FIGS. 9, 11 and 12, the gate electrode 201*g* of the first transistor T1 may cover a first channel region 101*pg*, the source electrode S1 of the first transistor T1 may be arranged at a first source electrode formation region 101*ps*, and the drain electrode D1 of the first transistor T1 may be arranged at a first drain electrode formation region 101*pd*.

The gate electrode 202*g* of the second transistor T2 may cover a second channel region 102*pg*, the source electrode S2 of the second transistor T2 may be arranged at a second source electrode formation region 102*ps*, and the drain electrode D2 of the second transistor T2 may be arranged at a second drain electrode formation region 102*pd*.

The gate electrode 203*g* of the third transistor T3 may cover a third channel region 103*pg*, the source electrode S3 of the third transistor T3 may be arranged at a third source electrode formation region 103*ps*, and the drain electrode D3 of the third transistor T3 may be arranged at a third drain electrode formation region 103*pd*.

The gate electrode 204*g* of the fourth transistor T4 may cover a fourth channel region 104*pg*, the source electrode S4 of the fourth transistor T4 may be arranged at a fourth source electrode formation region 104*ps*, and the drain electrode D4 of the fourth transistor T4 may be arranged at a fourth drain electrode formation region 104*pd*.

The gate electrode 205*g* of the fifth transistor T5 may cover a fifth channel region 105*pg*, the source electrode S5 of the fifth transistor T5 may be arranged at a fifth source electrode formation region 105*ps*, and the drain electrode D5 of the fifth transistor T5 may be arranged at a fifth drain electrode formation region 105*pd*.

The gate electrode 206*g* of the sixth transistor T6 may cover a sixth channel region 106*pg*, the source electrode S6 of the sixth transistor T6 may be arranged at a sixth source electrode formation region 106*ps*, and the drain electrode D6 of the sixth transistor T6 may be arranged at a sixth drain electrode formation region 106*pd*.

The gate electrode 207*g* of the seventh transistor T7 may cover a seventh channel region 107*pg*, the source electrode S7 of the seventh transistor T7 may be arranged at a seventh source electrode formation region 107*ps*, and the drain electrode D7 of the seventh transistor T7 may be arranged at a seventh drain electrode formation region 107*pd*.

The gate electrode 203*g* of the third transistor T3 may be reused as the first electrode plate Cst1 of the storage capacitor Cst, and the second electrode plate Cst2 of the storage capacitor Cst may be coupled to a power source signal line VDD.

Referring to FIG. 9 again, FIG. 9 shows a red light-emitting element and a blue light-emitting element. An anode of at least one of the red light-emitting element and the blue light-emitting element may cover the power source signal line pattern and the data line pattern simultaneously. Illustratively, an anode pattern 901 of the blue light-emitting element may cover the power source signal line pattern VDD1 and the data line pattern DATA1 simultaneously, and an anode pattern 902 of the red light-emitting element may cover the power source signal line pattern VDD2 and the data line pattern DATA2 simultaneously. Each power source signal line pattern and each data line pattern may longitudinally extend (e.g., in a direction Y) as a whole, so through the above arrangement, a relatively small segment difference may occur for the anode pattern in a longitudinal extension direction. In this way, it is able to improve color cast for the light-emitting element.

Although with the improvement in the color cast for the light-emitting element of the display panel, as shown in FIG. 10, a segment difference may still occur for the power source signal line pattern VDD and the data line pattern DATA in a horizontal extension direction (e.g., the direction X), so the subsequently-formed anode pattern 902 may tilt in the horizontal extension direction, and thereby an organic light-emitting material layer 902 on the anode pattern 902 may also tilt. At this time, during the display, the color cast may still occur for the display panel.

Figure 15:
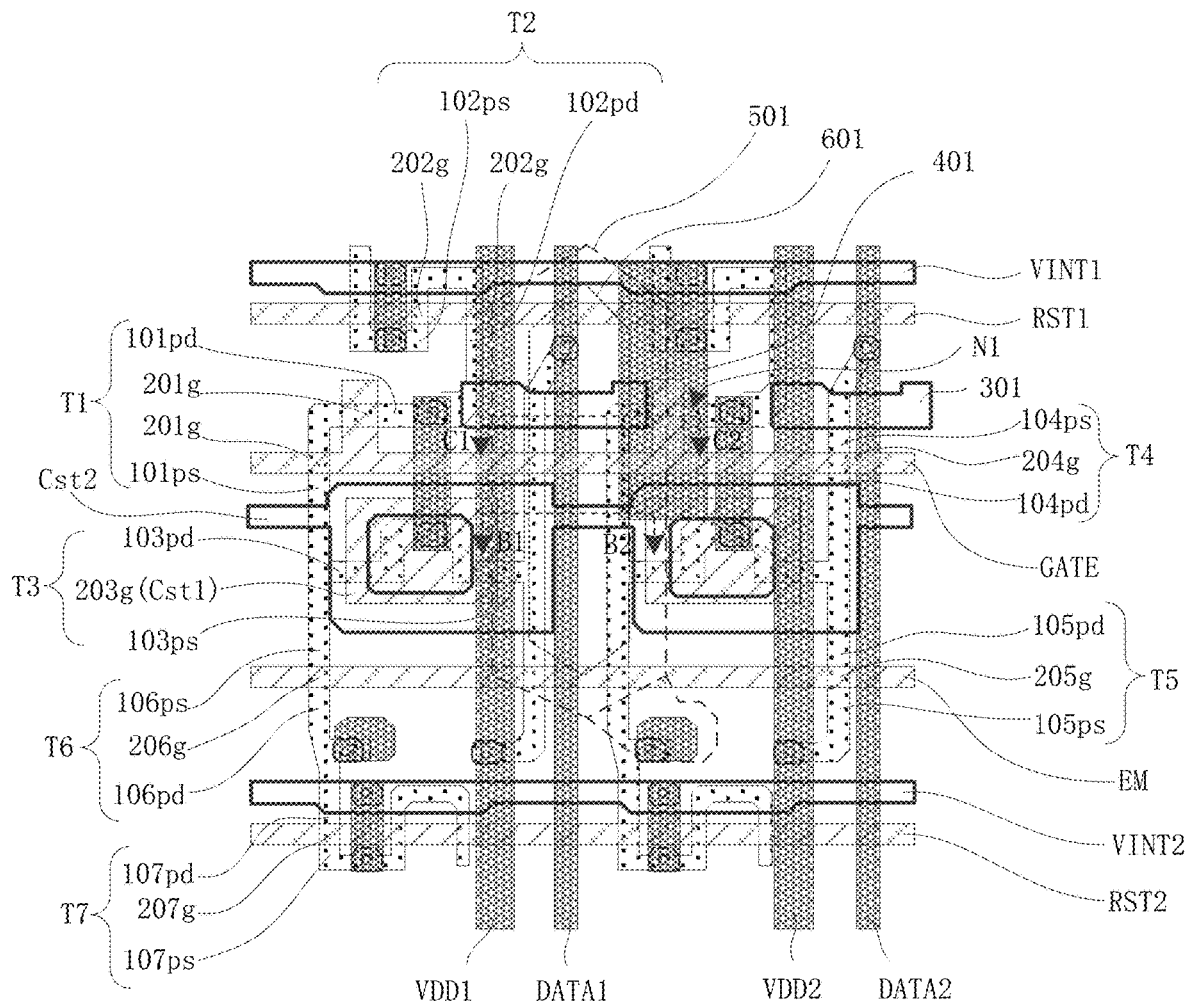
FIG. 15 is a second arrangement schematic view showing the subpixel driving circuitry in the display panel according to an embodiment of the present disclosure.
Figure 16:
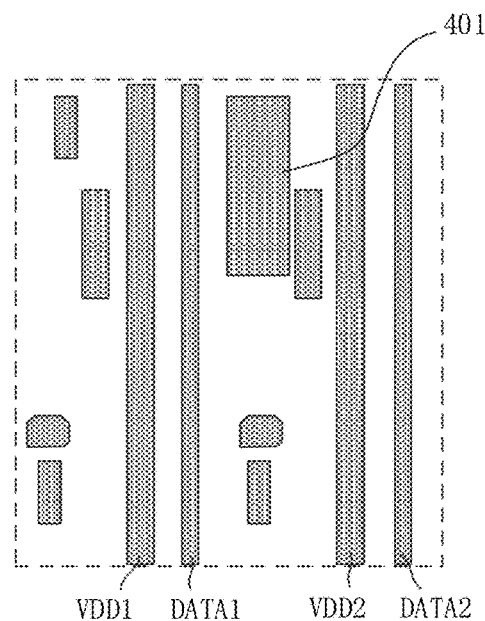
FIG. 16 is an arrangement schematic view showing the source/drain metal layer in FIG. 15.
Figure 17:
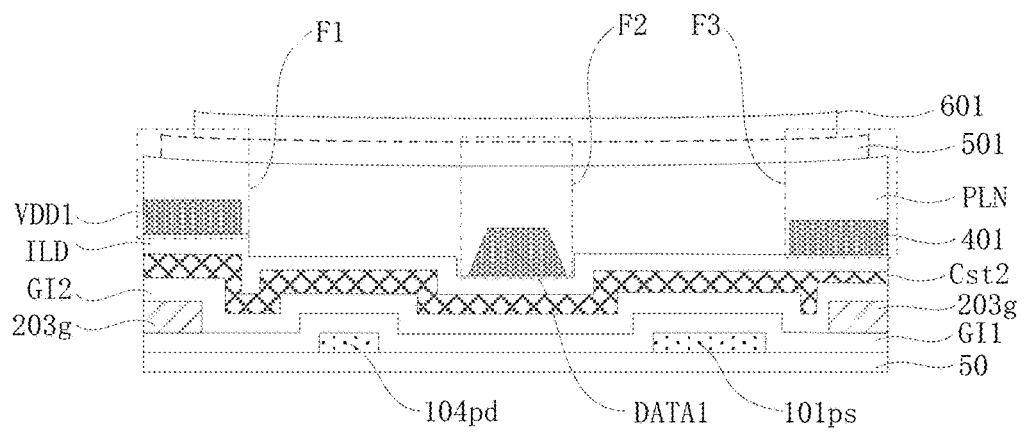
FIG. 17 is a sectional view along a line B1B2 in FIG. 15.

To solve the above problem, as shown in FIGS. 15 and 17, the present disclosure provides in some embodiments a display panel, which includes a base 50, a functional film layer arranged on the base 50, a plurality of first light-emitting elements arranged at a side of the functional film layer distal to the base 50, and a plurality of subpixel regions arranged in an array form. The functional film layer may include a power source signal line layer, a data line layer and a compensation functional layer, the power source signal line layer may include a power source signal line pattern (e.g., VDD1 and VDD2 in FIG. 15) arranged at each subpixel region, the data line layer may include a data line pattern (e.g., DATA1 and DATA2 in FIG. 15) arranged at each subpixel region, the power source signal line pattern may include a first portion extending in a first direction, each data line pattern may extend in the first direction, and the compensation functional layer may include a compensation functional pattern 401 arranged at at least one subpixel region. Each first light-emitting element may include a first anode 501, a first light-emitting pattern 601 and a first cathode sequentially laminated in a direction away from the base 50. An orthogonal projection of the first anode 501 onto the base 50 may overlap an orthogonal projection of a corresponding power source signal line pattern onto the base 50 at a first overlapping region F1, overlap an orthogonal projection of a corresponding data line pattern onto the base 50 at a second overlapping region F2, and overlap an orthogonal projection of a corresponding compensation functional pattern 401 onto the base 50 at a third overlapping region F3. The second overlapping region F2 may be arranged between the first overlapping region F1 and the third overlapping region F3.

To be specific, the plurality of subpixel regions arranged in an array form may include subpixel regions arranged in columns and extending in the first direction, and subpixel regions arranged in rows and extending in a second direction. The subpixel regions in columns may include a plurality of subpixel regions arranged in the first direction, and the subpixel regions in rows may include a plurality of subpixel regions arranged in the second direction crossing the first direction. Illustratively, the first direction may include a direction Y, and the second direction may include a direction X.

The power source signal line layer may include a power source signal line pattern arranged at each subpixel region. In a possible embodiment of the present disclosure, the power source signal line pattern may be of a grid-like structure, and the grid-like power source signal line pattern may include the first portion extending in the first direction. The power source signal line patterns may correspond to the subpixel regions respectively, and each power source signal line pattern may be arranged at a corresponding subpixel region. The power source signal line patterns VDD at the subpixel regions in a same column may be electrically connected to one another sequentially to form an integral structure.

The data line layer may include a data line pattern arranged at each subpixel region and extending in the first direction. The data line patterns may correspond to the subpixel regions respectively, and each data line pattern may be arranged at a corresponding subpixel region. The data line patterns DATA at the subpixel regions in a same column may be electrically connected to one another sequentially to form an integral structure.

The display panel may further includes the plurality of first light-emitting elements arranged at a side of the functional film layer distal to the base 50. Each first light-emitting element may include the first anode 501, the first light-emitting pattern 601 and the first cathode sequentially laminated in the direction away from the base 50. During the operation of the display panel, a driving signal may be applied to the first anode 501, and a common signal may be applied to the first cathode, so as to generate an electric field between the first anode 501 and the first cathode, thereby to control the first light-emitting pattern 601 to emit light in a corresponding color. Illustratively, the first light-emitting element may include a red light-emitting element capable of emitting red light.

The compensation functional layer may include the compensation functional pattern 401 arranged at at least one subpixel region. Illustratively, the compensation functional patterns 401 may correspond to the first light-emitting elements respectively.

During the arrangement of the display panel, the functional film layer may be formed on the base 50 at first, and then the first light-emitting elements may be formed at a side of the functional film layer distal to the base 50. During the arrangement of the functional film layer, the power source signal line patterns and the data line patterns may be arranged alternately in the second direction, and the compensation functional pattern 401 may be arranged in proximity to the corresponding first light-emitting element. Illustratively, the orthogonal projection of the first anode 501 of each first light-emitting element onto the base 50 may overlap the orthogonal projection of the corresponding power source signal line pattern onto the base 50 at the first overlapping region F1, overlap the orthogonal projection of the corresponding data line pattern onto the base 50 at the second overlapping region F2, and overlap the orthogonal projection of the corresponding compensation functional pattern 401 onto the base 50 at the third overlapping region F3. The second overlapping region F2 may be arranged between the first overlapping region F1 and the third overlapping region F3.

Based on the above-mentioned structure of the display panel, the compensation functional pattern 401 may compensate for a segment difference generated by the power source signal line pattern and the data line pattern under the first anode 501. Hence, in the display panel, when a part of the corresponding power source signal line pattern, a part of the corresponding data line pattern and at least a part of the corresponding compensation functional pattern 401 are covered by the first anode 501 of the first light-emitting element simultaneously, it is able to provide the first anode 501 with relatively high flatness, thereby to effectively prevent the occurrence of the color cast for the display panel during the display.

Figure 25:
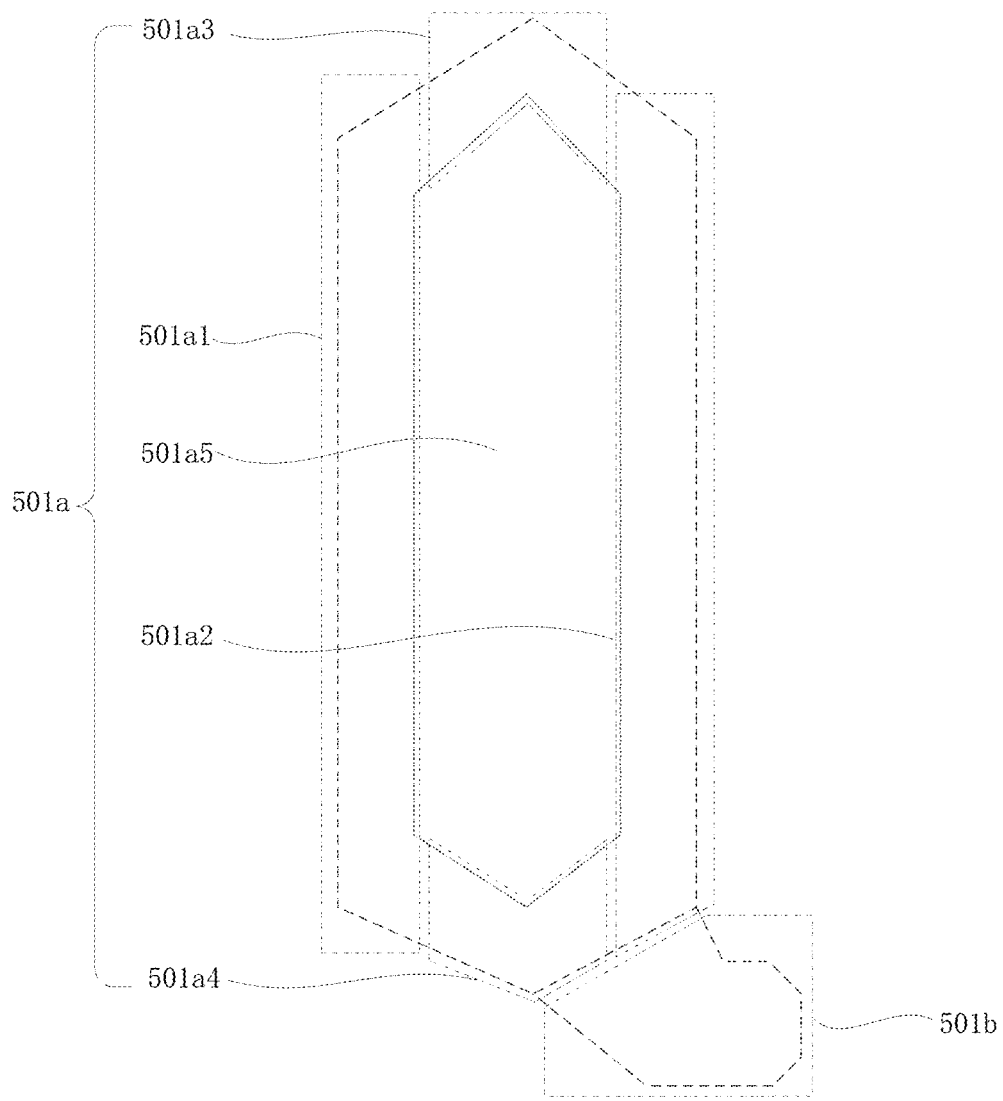
FIG. 25 is a structure schematic view showing a first anode according to an embodiment of the present disclosure.

As shown in FIG. 25, in some embodiments of the present disclosure, the first anode 501 may include a first edge portion 501a1 and a second edge portion 501a2 arranged opposite to each other in the second direction crossing the first direction, and a first intermediate portion 501a5 arranged between the first edge portion 501a1 and the second edge portion 501a2. An orthogonal projection of the first edge portion 501a1 onto the base 50 may include the first overlapping region F1, an orthogonal projection of the second edge portion 501a2 onto the base 50 may include the third overlapping region F3, and an orthogonal projection of the first intermediate portion 501a5 onto the base 50 may include the second overlapping region F2.

To be specific, the first anode 501 may be of various structures. For example, the first anode 501 may include the first edge portion 501a1 and the second edge portion 501a2 arranged opposite to each other in the second direction, and the first intermediate portion 501a5 arranged between the first edge portion 501a1 and the second edge portion 501a2. The first edge portion 501a1, the second edge portion 501a2 and the first intermediate portion may each extend in the first direction.

The orthogonal projection of the first edge portion 501a1 onto the base 50 may overlap the orthogonal projection of the corresponding power source signal line pattern onto the base 50 to form the first overlapping region F1, the orthogonal projection of the first intermediate portion 501a5 onto the base 50 may overlap the orthogonal projection of the corresponding data line pattern onto the base 50 to form the second overlapping region F2, and the orthogonal projection of the second edge portion 501a2 onto the base 50 may overlap the orthogonal projection of the corresponding compensation functional pattern 401 onto the base 50 to form the third overlapping region F3.

In the above display panel, the first edge portion 501a1 and the second edge portion 501a2 of the first anode 501 arranged opposite to each other in the second direction may cover the corresponding power source signal line pattern and the corresponding compensation functional pattern 401 respectively, and the intermediate portion of the first anode 501 between the first edge portion 501a1 and the second edge portion 501a2 may cover the corresponding data line pattern. In this way, the power source signal line pattern, the data line pattern and the compensation functional pattern 401 may be evenly distributed at a region covered by the first anode 501, so as to ensure the flatness of the first anode 501 in a better manner.

As shown in FIGS. 15 and 25, in some embodiments of the present disclosure, the orthogonal projection of the first edge portion 501a1 onto the base 50 may not overlap an orthogonal projection of the first light-emitting pattern 601 onto the base 50, the orthogonal projection of the second edge portion 501a2 onto the base 50 may not overlap the orthogonal projection of the first light-emitting pattern 601 onto the base 50, and the orthogonal projection of the first intermediate portion 501a5 onto the base 50 may overlap the orthogonal projection of the first light-emitting pattern 601 onto the base 50.

To be specific, when the first light-emitting pattern 601 is formed at a surface of the first anode 501 distal to the base 50, the first light-emitting pattern 601 may be arranged in various modes. For example, the orthogonal projection of the first light-emitting pattern 601 onto the base 50 may be arranged between the orthogonal projection of the first edge portion onto the base 50 and the orthogonal projection of the second edge portion onto the base 50, and overlap the orthogonal projection of the first intermediate portion 501a5 onto the base 50. When the first light-emitting pattern 601 is arranged as mentioned above, the first light-emitting pattern 601 may be located at a surface in the middle of the first anode 501. Because the surface in the middle of the first anode 501 has higher flatness, so it is able to improve the flatness of the first light-emitting pattern 601.

As shown in FIG. 25, in some embodiments of the present disclosure, the first intermediate portion 501a5 may be a centrosymmetric pattern, and the orthogonal projection of the first intermediate portion 501a5 onto the base 50 may coincide with the orthogonal projection of the first light-emitting pattern 601 onto the base 50.

To be specific, in a possible embodiment of the present disclosure, the first intermediate portion 501a5 of the first anode 501 may be a centrosymmetric pattern. For example, the orthogonal projection of the first intermediate portion 501a5 onto the base 50 may be a hexagon. In this case, when the orthogonal projection of the first light-emitting pattern 601 onto the base 50 coincides with the orthogonal projection of the first intermediate portion 501a5 onto the base 50, the first light-emitting pattern 601 may also be a centrosymmetric pattern. Through the first intermediate portion 501a5 and the first light-emitting pattern 601 with the above-mentioned structure, it is able to improve the flatness and the luminance uniformity of the first light-emitting pattern 601.

In some embodiments of the present disclosure, a ratio of a sum of an area of the first overlapping region F1 and an area of the second overlapping region F2 to an area of the third overlapping region F3 may be approximately 2:1.

To be specific, during the arrangement of the first anode 501, the power source signal line pattern, the data line pattern and the compensation functional pattern 401, the flatness of the first anode 501 may be adjusted through controlling an overlapping degree of the first anode 501 with the power source signal line pattern, the data line pattern and the compensation functional pattern 401 in a direction perpendicular to the base 50. For example, the ratio of the sum of the area of the first overlapping region F1 and the area of the second overlapping region F2 to the area of the third overlapping region F3 may be set to be approximately 2:1, so as to enable the areas of the first overlapping region, the second overlapping region and the third overlapping region to approach to each other, i.e., enable areas of the power source signal line pattern, the data line pattern and the compensation functional pattern 401 covered by the first anode 501 to approach to each other, thereby to improve the flatness of the first anode 501.

As shown in FIG. 15, in some embodiments of the present disclosure, the functional film layer may further include a gate scanning line layer, an initialization signal line layer, a resetting signal line layer and a light-emission control signal line layer. The gate scanning line layer may include a gate scanning line pattern GATE arranged at each subpixel region, the initialization signal line layer may include an initialization signal line pattern VINT arranged at each subpixel region, the resetting signal line layer may include a resetting signal line pattern RST arranged at each subpixel region, and the light-emission control signal line layer may include a light-emission control signal line pattern EM arranged at each subpixel region. The gate scanning line pattern GATE, the initialization signal line pattern VINT, the resetting signal line pattern RST and the light-emission control signal line pattern EM may each extend in the second direction crossing the first direction.

To be specific, the gate scanning line layer may include the gate scanning line pattern GATE arranged at each subpixel region and extending in the second direction, and the gate scanning line patterns GATE corresponding to the subpixel regions in a same row may be electrically connected one another sequentially to form an integral structure.

The gate scanning line layer may include the initialization signal line pattern VINT arranged at each subpixel region, the initialization signal line layer extends in the second direction, and the initialization signal line patterns VINT corresponding to the subpixel regions in the same row may be electrically connected one another sequentially to form an integral structure.

The resetting signal line layer may include the resetting signal line pattern RST arranged at each subpixel region and extending in the second direction, and the resetting signal line patterns RST corresponding to the subpixel regions in the same row may be electrically connected one another sequentially to form an integral structure.

The light-emission control signal line layer may include the light-emission control signal line pattern EM arranged at each subpixel region and extending in the second direction, and the light-emission control signal line patterns EM corresponding to the subpixel regions in the same row may be electrically connected one another sequentially to form an integral structure.

As shown in FIGS. 15 and 25, in some embodiments of the present disclosure, the first anode 501 may further include a third edge portion 501a3 and a fourth edge portion 501a4 arranged opposite to each other in the first direction, the first intermediate portion 501a5 may be arranged between the third edge portion 501a3 and the fourth edge portion 501a4, the third edge portion 501a3 may be coupled to the first edge portion 501a1 and the second edge portion 501a2, the fourth edge portion 501a4 may be coupled to the first edge portion 501a1 and the second edge portion 501a2, and the orthogonal projection of the first intermediate portion 501a5 onto the base 50 may overlap an orthogonal projection of a corresponding gate scanning line pattern onto the base 50 and an orthogonal projection of a corresponding resetting signal line pattern onto the base 50 at a sixth overlapping region.

To be specific, the first anode 501 may further include the third edge portion 501a3 and the fourth edge portion 501a4 arranged opposite to each other in the first direction, the first intermediate portion 501a5 may be arranged between the third edge portion 501a3 and the fourth edge portion 501a4, and the first edge portion 501a1, the second edge portion 501a2, the third edge portion 501a3 and the fourth edge portion 501a4 may together surround the first intermediate portion.

During the arrangement of the first anode 501, an orthogonal projection of the third edge portion 501a3 onto the base 50 may overlap the orthogonal projection of the corresponding initialization signal line pattern VINT (e.g., the first initialization signal line pattern VINT1 in FIG. 15) onto the base 50 to form a fourth overlapping region, an orthogonal projection of the fourth edge portion 501a4 onto the base 50 may overlap the orthogonal projection of the corresponding light-emission control signal line pattern EM onto the base 50 to form a fifth overlapping region, and the orthogonal projection of the first intermediate portion 501a5 onto the base 50 may overlap the orthogonal projection of the corresponding gate scanning line pattern GATE onto the base 50 and the orthogonal projection of the corresponding resetting signal line pattern RST (e.g., the first resetting signal line pattern RST1 in FIG. 15) onto the base 50 to form a sixth overlapping region. In this way, the fourth overlapping region and the fifth overlapping region may be arranged opposite to each other in the first direction, and the sixth overlapping region may be arranged between the fourth overlapping region and the fifth overlapping region, so as to enable the initialization signal line pattern VINT, the light-emission control signal line pattern EM, the gate scanning line pattern GATE and the resetting signal line pattern RST covered by the first anode 501 to be evenly distributed at a region covered by the first anode 501, thereby to ensure the flatness of the first anode 501 in a better manner.

As shown in FIG. 25, in some embodiments of the present disclosure, the first anode 501 may include a body portion 501a and a via-hole connection portion 501b, the body portion 501a may include the first edge portion 501a1, the second edge portion 501a2, the third edge portion 501a3, the fourth edge portion 501a4 and the first intermediate portion 501a5, and the body portion 501a may be a centrosymmetric pattern.

To be specific, the first anode 501 may include the body portion 501a and the via-hole connection portion 501b coupled to each other. The first light-emitting pattern 601 may be formed at a surface of the body portion 501a distal to the base 50. The via-hole connection portion 501b is configured to be coupled to a corresponding subpixel driving circuitry of the display panel through a via-hole, so as to receive a driving signal provided by the subpixel driving circuitry.

When the first anode 501 includes the body portion 501a and the via-hole connection portion 501b, it is able to prevent the formation of the via-hole in a portion of the first anode 501 for forming the first light-emitting pattern 601, thereby to ensure a luminous effect of the first light-emitting element. In addition, when the body portion 501a includes the first edge portion 501a1, the second edge portion 501a2, the third edge portion 501a3, the fourth edge portion 501a4 and the first intermediate portion 501a5 and the body portion 501a is a centrosymmetric pattern, parts of the power source signal line pattern VDD (e.g., VDD1 in FIG. 15), the data line pattern DATA (DATA1 in FIG. 15), the gate scanning line pattern GATE, the resetting signal line pattern RST (e.g., the first resetting signal line pattern RST1 in FIG. 15), the light-emission control signal line pattern EM and the initialization signal line pattern VINT (e.g., the first initialization signal line pattern VINT1) covered by the first anode 501 to be evenly distributed under the first anode 501, thereby to improve the flatness of the first anode 501.

As shown in FIGS. 12, 13, 16, 17 and 18, in some embodiments of the present disclosure, the display panel may include a first metal layer, a second metal layer and a third metal layer. The gate scanning line layer, the resetting signal line layer and the light-emission control signal line layer may be arranged in the first metal layer, the initialization signal line layer may be arranged in the second metal layer, and the data line layer, the power source signal line layer and the compensation functional layer may be arranged in the third metal layer. The functional film layer may further include a first insulation layer (e.g., GI2 in FIG. 17) and a second insulation layer (e.g., ILD in FIG. 17), the first insulation layer may be arranged between the first metal layer and the second metal layer, and the second insulation layer may be arranged between the second metal layer and the third metal layer.

To be specific, during the arrangement of the display panel, the functional layer patterns extending in a same direction may be formed at a same layer. For example, the gate scanning line layer, the resetting signal line layer and the light-emission control signal line layer may be arranged at a same layer and together form the first metal layer, and the data line layer, the power source signal line layer and the compensation functional layer may be arranged at a same layer and together form the third metal layer.

The display panel may have a limited layout space at a same layer due to a constant size of the display panel. When it is impossible to form the functional layer patterns extending in the same direction at a same layer, parts of the functional layer patterns may be arranged at the other film layer. For example, the initialization signal line layer may form the second metal layer, and the second metal layer may be arranged at a layer different from the first metal layer.

It should be appreciated that, during the formation of the metal layers, an insulation layer may be formed between two adjacent metal layers so as to prevent the occurrence of a short circuit between the adjacent metal layers. For example, the functional film layer may further include the first insulation layer and the second insulation layer, the first insulation layer may be arranged between the first metal layer and the second metal layer, and the second insulation layer may be arranged between the second metal layer and the third metal layer.

In the above-mentioned display panel, the functional layer patterns extending in the same direction may be arranged at a same layer, and the insulation layer may be arranged between the adjacent conductive film layers, so as to utilize the layout space of the display panel to the greatest extent while preventing the occurrence of the short circuit between the functional patterns of the display panel, thereby to provide a thin display panel.

As shown in FIG. 15, in some embodiments of the present disclosure, the compensation functional pattern 401 may be made of a conductive material and coupled to the initialization signal line pattern VINT (e.g., the first initialization signal line pattern VINT1 in FIG. 15).

To be specific, the material of the compensation functional pattern 401 may be set according to the practical need. For example, it may include a conductive material or an insulating material. When the compensation functional pattern 401 is made of a conductive material, it may be coupled to a fixed signal output end, so as to enable the compensation functional pattern 401 to be at a fixed potential, thereby to prevent the stability of the display panel from being adversely affected when the compensation functional pattern 401 is in a floating state.

Further, the initialization signal line pattern VINT may be reused as a fixed potential output end. Because the initialization signal line pattern VINT is used to transmit an initialization signal at a fixed potential, when the compensation functional pattern 401 is coupled to the initialization signal line pattern VINT, the compensation functional pattern 401 may be at a same fixed potential as the initialization signal.

When the initialization signal line pattern VINT is reused as the fixed potential output end as mentioned above, it is unnecessary to provide a display substrate with an additional fixed potential output end dedicated for applying a fixed potential to the compensation functional pattern 401, thereby to effectively improve the layout space of the functional film layer. In addition, it is able to increase a voltage across an initialization signal line, and provide the initialization signal transmitted on the initialization signal line with more stable voltage, thereby to improve the stability of the subpixel driving circuitry.

It should be appreciated that, referring to FIG. 5 again, when the initialization signal line pattern VINT is reused as the fixed potential output end, the orthogonal projection of the compensation functional pattern 401 onto the base 50 may overlap the orthogonal projection of the initialization signal line pattern VINT onto the base 50 at an overlapping region. In this way, a via-hole may be formed in the overlapping region, so as to enable the compensation functional pattern 401 to be coupled to the initialization signal line pattern VINT.

In some embodiments of the present disclosure, the compensation functional pattern 401 may be arranged at a same layer as the data line pattern DATA.

To be specific, during the formation of the compensation functional pattern 401, the compensation functional pattern 401 may be arranged at a same layer as the data line pattern DATA, so as to prevent the compensation functional pattern 401 from being arranged at an individual layer, thereby to reduce a thickness of the display panel.

Further, the compensation functional pattern 401 may be made of a same material as the data line pattern DATA, so as to form the compensation functional pattern 401 and the data line pattern DATA through a single patterning process, thereby to effectively simplify a manufacture procedure of the display panel and reduce the manufacture cost thereof.

In some embodiments of the present disclosure, the display panel may further include a plurality of subpixel driving circuitries, a first part of the subpixel driving circuitries may correspond to the first light-emitting elements respectively and each of the first part of the subpixel driving circuitries is configured to drive a corresponding first light-emitting element to emit light. Each subpixel driving circuitry may include a driving transistor, a first transistor, a second transistor, a fourth transistor and a storage capacitor.

A gate electrode of the first transistor may be coupled to a corresponding gate scanning line pattern GATE, a first electrode of the first transistor may be coupled to a second electrode of the driving transistor, and a second electrode of the first transistor may be coupled to a gate electrode of the driving transistor. A gate electrode of the second transistor may be coupled to a corresponding resetting signal line pattern RST, a first electrode of the second transistor may be coupled to a corresponding initialization signal line pattern VINT, and a second electrode of the second transistor may be coupled to the gate electrode of the driving transistor. A gate electrode of the fourth transistor may be coupled to the corresponding gate scanning line pattern GATE, a first electrode of the fourth transistor may be coupled to a corresponding data line pattern DATA, and a second electrode of the fourth transistor may be coupled to a first electrode of the driving transistor. The first electrode of the driving transistor may be coupled to a corresponding power source signal line pattern VDD, and the second electrode of the driving transistor may be coupled to a corresponding first light-emitting element. A first electrode plate of the storage capacitor may be coupled to the gate electrode of the driving transistor, and a second electrode plate of the storage capacitor may be coupled to the corresponding power source signal line pattern VDD.

For example, the functional film layer may include n+1 power source signal line patterns VDD, n+1 data line patterns DATA, n+1 gate scanning line patterns GATE, n+1 initialization signal line patterns VINT, n+1 resetting signal line patterns RST and n+1 light-emission control signal line patterns EM. The display panel may include a plurality of subpixel driving circuitries corresponding to the subpixel regions respectively. The plurality of subpixel driving circuitries may be arranged in n+1 rows and n+1 columns. The n+1 power source signal line patterns VDD may correspond to the subpixel driving circuitries in n+1 columns respectively, the n+1 data line patterns DATA may correspond to the subpixel driving circuitries in n+1 columns respectively, the n+1 gate scanning line patterns GATE may correspond to the subpixel driving circuitries in n+1 rows respectively, the n+1 initialization signal line patterns VINT may correspond to the subpixel driving circuitries in n+1 rows respectively, the n+1 resetting signal line patterns RST may correspond to the subpixel driving circuitries in n+1 rows respectively, and the n+1 light-emission control signal line patterns EM may correspond to the subpixel driving circuitries in n+1 rows respectively.

Based on the above illustrative structure, the specific structure of the subpixel driving circuitry and a connection mode of the signal line patterns will be described hereinafter in mode details by taking the subpixel driving circuit in an $n^{th}$ row and an $n^{th}$ column as an example.

As shown in FIGS. 7 and 15, the subpixel driving circuitry may include a driving transistor (i.e., the third transistor T3), a first transistor T1, a second transistor T2, a fourth transistor T4 and a storage capacitor Cst. The first transistor T1, the second transistor T2 and the fourth transistor T4 may each be a P-type transistor.

A gate electrode 201g of the first transistor T1 may be coupled to the corresponding gate scanning line pattern GATE, a first electrode (i.e., a source electrode S1) thereof may be coupled to a second electrode (i.e., a drain electrode D3) of the third transistor T3, and a second electrode (i.e., a drain electrode D1) thereof may be coupled to a gate electrode 203g of the third transistor T3.

A gate electrode 202g of the second transistor T2 may be coupled to the corresponding resetting signal line pattern RST1, a first electrode (i.e., a source electrode S2) thereof may be coupled to a corresponding first initialization signal line pattern VINT1, and a second electrode (i.e., a drain electrode D2) thereof may be coupled to the gate electrode 203g of the third transistor T3.

A gate electrode 204g of the fourth transistor T4 may be coupled to the corresponding gate scanning line pattern GATE, a first electrode (i.e., a source electrode S4) thereof may be coupled to the corresponding data line pattern DATA, and a second electrode (i.e., a drain electrode D4) thereof may be coupled to a first electrode (i.e., a source electrode S3) of the third transistor T3.

The first electrode (i.e., the source electrode S3) of the third transistor T3 may be coupled to the power source signal line pattern VDD, and a second electrode (i.e., a drain electrode D3) of the third transistor T3 may be coupled to a corresponding OLED.

The first electrode plate Cst1 of the storage capacitor Cst may be coupled to the gate electrode 203g of the third transistor T3, and the second electrode plate Cst2 thereof may be coupled to the power source signal line pattern VDD.

In some embodiments of the present disclosure, the functional film layer may further include a light-emission control signal line pattern and a second resetting signal line pattern RST2. The subpixel driving circuitry may further include a fifth transistor, a sixth transistor and a seventh transistor. A gate electrode of the fifth transistor may be coupled to the light-emission control signal line pattern, a first electrode thereof may be coupled to the power source signal line pattern VDD, and a second electrode thereof may be coupled to the first electrode of the driving transistor. A gate electrode of the sixth transistor may be coupled to the light-emission control signal line pattern, a first electrode thereof may be coupled to the second electrode of the driving transistor, and a second electrode thereof maybe coupled to the corresponding light-emitting element. A gate electrode of the seventh transistor may be coupled to the second resetting signal line pattern, a first electrode thereof may be coupled to the initialization signal line, and a second electrode thereof may be coupled to the second electrode of the sixth transistor.

To be specific, as shown in FIGS. 7 and 15, taking the subpixel driving circuitry in the $n^{th}$ row and the $n^{th}$ column as an example again, a gate electrode 205g of the fifth transistor T5 may be coupled to the light-emission control signal line pattern EM, a first electrode (i.e., a source electrode S5) thereof may be coupled to the power source signal line pattern VDD, and a second electrode (i.e., a drain electrode D5) thereof may be coupled to the first electrode (i.e., the source electrode S3) of the driving transistor (i.e., the third transistor T3).

A gate electrode 206g of the sixth transistor T6 may be coupled to the light-emission control signal line pattern EM, a first electrode (i.e., a source electrode S6) thereof may be coupled to the second electrode (i.e., the drain electrode D3) of the driving transistor (i.e., the third transistor T3), and a second electrode (i.e., a drain electrode D6) thereof may be coupled to the corresponding OLED.

A gate electrode 207g of the seventh transistor T7 may be coupled to the second resetting signal line pattern RST2 (for example, the second resetting signal line pattern RST2 may be a resetting signal line pattern RST corresponding to the subpixel driving circuitries in an $(n+1)^{th}$ row), a first electrode (e.g., a source electrode S7) thereof may be coupled to the second initialization signal line pattern VINT2 (for example, the second initialization signal line pattern VINT2 may be an initialization signal line pattern VNT corresponding to the subpixel driving circuitries in the $(n+1)^{th}$ row), and a second electrode (i.e., a drain electrode D7) thereof may be coupled to the second electrode (i.e., the drain electrode D6) of the sixth transistor T6.

In the above-mentioned display panel, when the subpixel driving circuitry further includes the fifth transistor T5, the sixth transistor T6 and the seventh transistor T7, it is able for the subpixel driving circuitry to merely drive the corresponding OLED to emit light at a light-emission stage, and prevent the OLED from emitting light abnormally, thereby to improve the display quantity of the display panel in a better manner.

Figure 21:
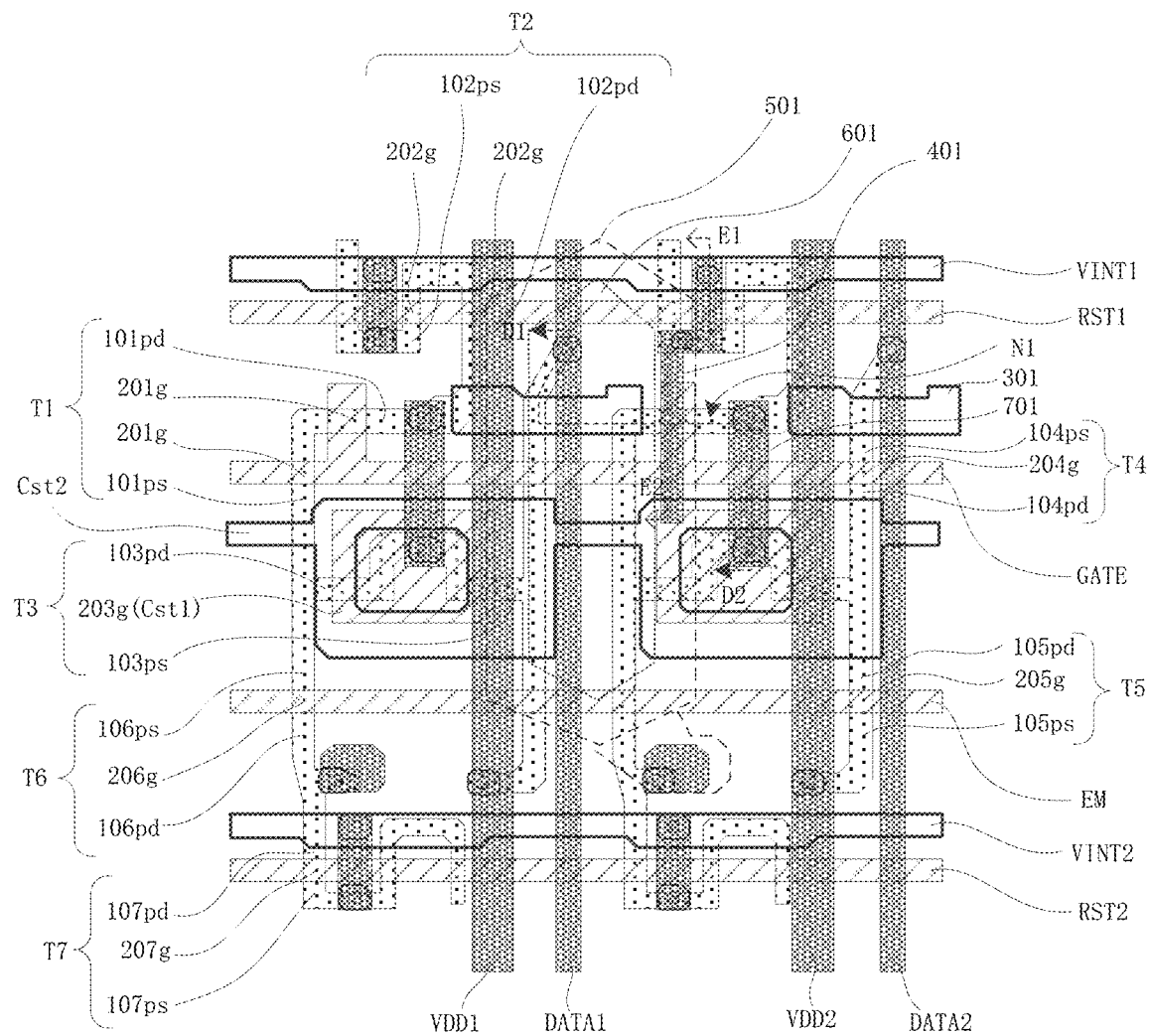
FIG. 21 is a fifth arrangement schematic view showing the subpixel driving circuitry in the display panel according to an embodiment of the present disclosure.
Figure 22:
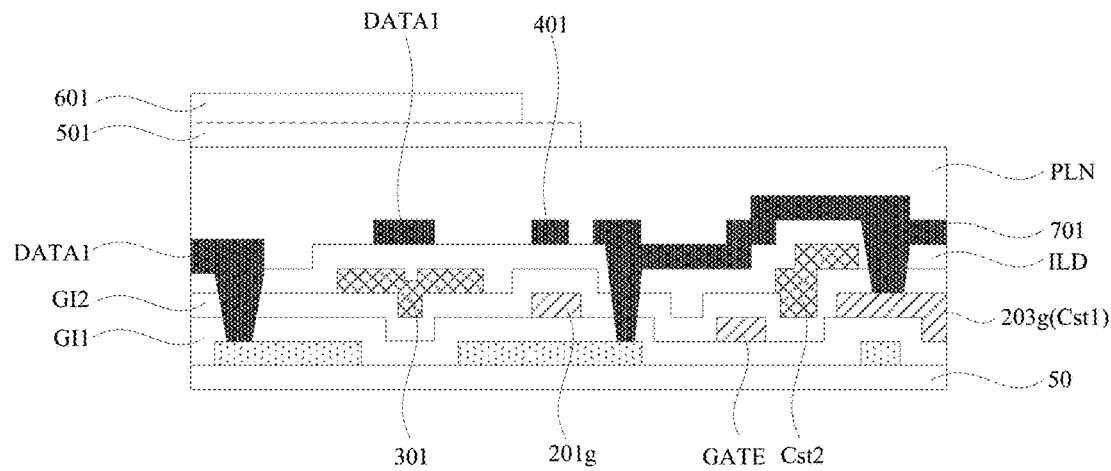
FIG. 22 is a sectional view along a line D1D2 in FIG. 21.

As shown in FIGS. 21 and 22, in some embodiments of the present disclosure, the subpixel driving circuitry may further include a first conductive connection member 701 through which the second electrode (i.e., the drain electrode D1) of the first transistor T1 is coupled to the gate electrode of the driving transistor (i.e., the gate electrode 203g of the third transistor T3). The display panel may further include a third metal layer, the first conductive connection member 701 may be arranged at the third metal layer, and an orthogonal projection of the first conductive connection member in each of the first part of the subpixel driving circuitries onto the base may not overlap the orthogonal projection of the corresponding first anode 501 onto the base.

To be specific, the compensation functional pattern 401 may be arranged between the data line pattern (e.g., DATA1) and the first conductive connection member of each of the first part of the subpixel driving circuitries, and the data line pattern may be arranged directly under the first anode in each of the first part of the subpixel driving circuitries. In the display panel with the above-mentioned structure, through the compensation functional pattern 401, it is able to separate the gate electrode of the driving transistor (i.e., the gate electrode 203g of the third driving transistor T3) from the data line pattern (e.g., DATA1), so as to prevent the occurrence of crosstalk for a potential at the gate electrode of the driving transistor due to a change in a signal on the data line pattern. In addition, in the display panel with the above-mentioned structure, it is also able to prevent the occurrence of a short circuit between the first conductive connection member 701 and the compensation functional pattern 401.

Figure 23:
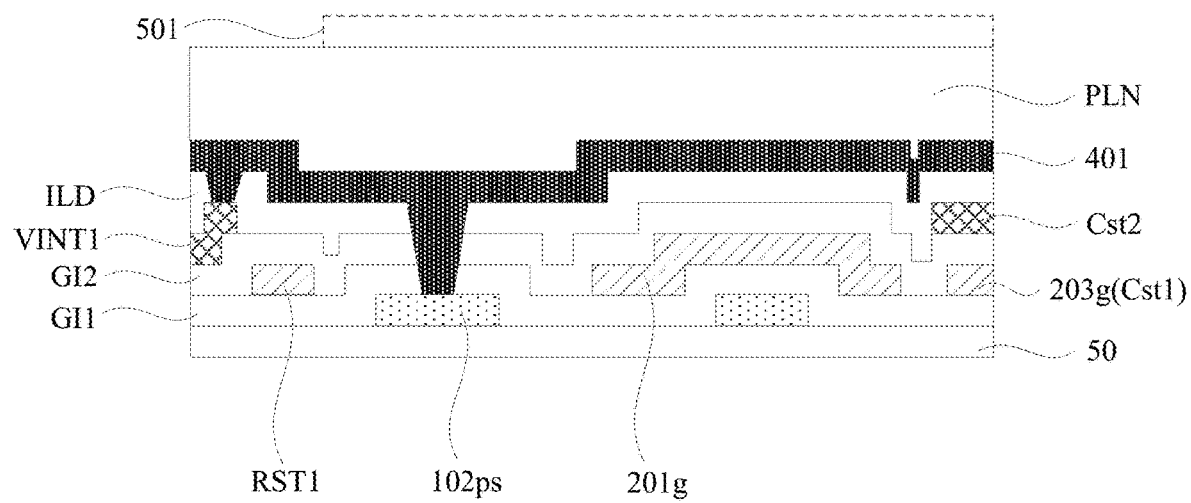
FIG. 23 is a sectional view along a line E1E2 in FIG. 21.

Further, as shown in FIGS. 21 and 23, the compensation functional pattern 401 may be coupled to the initialization signal line pattern (e.g., VINT1), so as to enable the compensation functional pattern 401 to be at a fixed potential, thereby to further prevent the occurrence of the crosstalk for the potential at the gate electrode of the driving transistor due to the change in the signal on the data line pattern.

In addition, the first conductive connection member 701 may be arranged at the first metal layer, so as to form the first conductive connection member 701 and the other patterns at the third metal layer through a single patterning process, thereby to simplify the manufacture process of the display substrate.

Figure 24:
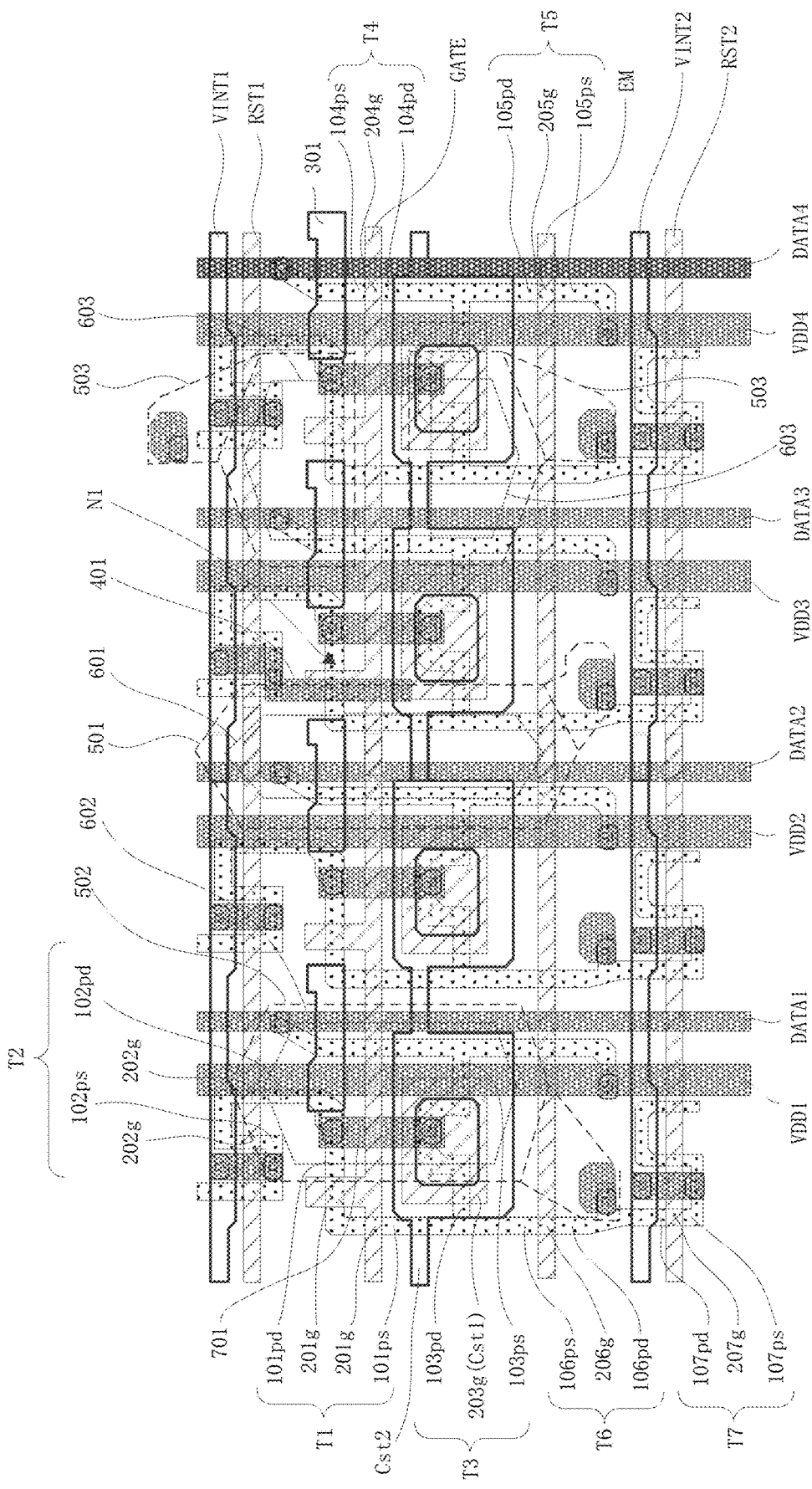
FIG. 24 is an arrangement schematic view showing the subpixel driving circuitry corresponding to one pixel unit according to an embodiment of the present disclosure.

As shown in FIG. 24, in some embodiments of the present disclosure, the display panel may further include a plurality of second light-emitting elements and a plurality of third light-emitting elements. Each second light-emitting element may include a second anode 502, a second light-emitting pattern 602 and a second cathode sequentially laminated in the direction away from the base, each third light-emitting element may include two light-emitting sub-elements arranged opposite to each other in the first direction, and each light-emitting sub-element may include a third anode 503, a third light-emitting pattern 603 and a third cathode sequentially laminated in the direction away from the base. The plurality of subpixel driving circuitries may further include a second part of the subpixel driving circuitries and a third part of the subpixel driving circuitries, the second part of the subpixel driving circuitries may correspond to the second light-emitting elements respectively, each of the second part of the subpixel driving circuitries is configured to drive a corresponding second light-emitting element to emit light, the third part of the subpixel driving circuitries may correspond to the light-emitting sub-elements respectively, and each of the third part of the subpixel driving circuitries is configured to drive a corresponding light-emitting sub-element to emit light. The orthogonal projection of the first conductive connection member in each of the second part of the subpixel driving circuitries onto the base may overlap an orthogonal projection of a corresponding second anode 502 onto the electrode, and the orthogonal projection of the first conductive connection member in each of the third part of the subpixel driving circuitries onto the base may overlap an orthogonal projection of a corresponding third anode 503 onto the base.

As mentioned above, when the orthogonal projection of the first conductive connection member in each of the second part of the subpixel driving circuitries onto the base overlaps the orthogonal projection of the corresponding second anode 502 onto the base, and the orthogonal projection of the first conductive connection member in each of the third part of the subpixel driving circuitries onto the base overlaps the orthogonal projection of the corresponding third anode 503 onto the base, it is able to provide each of the second anode 502 and the third anode 503 with higher flatness.

As shown in FIG. 15, in some embodiments of the present disclosure, the gate electrode 201g of the first transistor T1 may be in direct contact with the corresponding gate scanning line pattern GATE.

To be specific, the gate electrode 201g of the first transistor T1 may be arranged at a same layer as the corresponding gate scanning line pattern GATE to form an integral structure. In this way, the gate electrode 201g of the first transistor T1 and the corresponding gate scanning line pattern GATE may be formed through a single patterning process, and the formatted gate electrode of the first transistor may be in direct contact with the corresponding gate scanning line pattern GATE, i.e., it is unnecessary to provide an additional conductive connection member for connecting the gate electrode of the first transistor and the corresponding gate scanning line pattern GATE.

In some embodiments of the present disclosure, each of the gate electrode of the second transistor and the gate electrode of the seventh transistor may be formed integrally with the corresponding gate scanning line pattern GATE, or each of the gate electrode of the second transistor and the gate electrode of the seventh transistor may be in direct contact with the corresponding gate scanning line pattern GATE, or each of the gate electrode of the second transistor and the gate electrode of the seventh transistor may serve as a part of the corresponding gate scanning line pattern GATE.

In some embodiments of the present disclosure, an orthogonal projection of the first electrode of the first transistor onto the base 50 may at least partially overlap the orthogonal projection of the corresponding compensation functional pattern 401 onto the base 50, and/or an orthogonal projection of the second electrode of the first transistor onto the base 50 may at least partially overlap the orthogonal projection of the corresponding compensation functional pattern 401 onto the base 50.

To be specific, as shown in FIG. 15, in the subpixel driving circuitry with the above-mentioned structure, the orthogonal projection of the compensation functional pattern 401 onto the base 50 may at least partially overlap the orthogonal projection of the second electrode (i.e., node N1 in FIG. 15) of the first transistor T1 onto the base 50, and/or the orthogonal projection of the compensation functional pattern 401 onto the base 50 may at least partially overlap the orthogonal projection of the first electrode (formed at 101ps in FIG. 15) of the first transistor T1 onto the base 50.

Based on the above-mentioned arrangement mode, in a direction perpendicular to the base 50, the compensation functional pattern 401 may cover the second electrode and/or the first electrode of the first transistor T1, so as to shield the second electrode and/or the first electrode of the first transistor T1, thereby to prevent the occurrence of the crosstalk for the first transistor T1 due to a change in a data signal transmitted on the data line pattern DATA adjacent to the first transistor T1. In addition, because the second electrode of the first transistor T1 is coupled to the gate electrode 203g of the third transistor T3 and the first electrode of the first transistor T1 is coupled to the second electrode of the third transistor T3, it is able to further prevent the occurrence of the crosstalk for the third transistor T3 due to the change in the data signal transmitted on the data line pattern DATA adjacent to the first transistor T1.

As shown in FIG. 21, in some embodiments of the present disclosure, the orthogonal projection of the first electrode of the first transistor T1 onto the base may not overlap the orthogonal projection of the corresponding compensation functional pattern 401 onto the base; and/or the orthogonal projection of the second electrode of the first transistor T1 onto the base may not overlap the orthogonal projection of the corresponding compensation functional pattern onto the base.

Based on the above arrangement mode, it is able to provide a relatively large distance between the compensation functional pattern 401 and the first conductive connection member 701, thereby to prevent the occurrence of the short circuit between the compensation functional pattern 401 and the first conductive connection member 701. In addition, it is able to prevent the generation of a parasitic capacitor between the compensation functional pattern 401 and the shielding pattern 301 while ensuring the flatness of the first anode 501.

In some embodiments of the present disclosure, the subpixel driving circuitry may further include a seventh transistor T7, a gate electrode 207g of the seventh transistor T7 may be coupled to the resetting signal line pattern (e.g., RST2 in FIG. 15), a second electrode of the seventh transistor T7 in each of the first part of the subpixel driving circuitries may be coupled to the first anode 501, an orthogonal projection of the first electrode of the seventh transistor T7 in each of the first part of the subpixel driving circuitries onto the base 50 may overlap the orthogonal projection of the corresponding compensation functional pattern 401 onto the base 50 at a seventh overlapping region, and the first electrode of the seventh transistor may be coupled to the corresponding compensating functional pattern 401 through a via-hole in the seventh overlapping region and indirectly coupled to the corresponding initialization signal line pattern VINT through the compensation functional pattern 401.

To be specific, when the orthogonal projection of the first electrode of the seventh transistor onto the base 50 overlaps the orthogonal projection of the corresponding compensation functional pattern 401 onto the base 50 at the seventh overlapping region, the via-hole may be formed in the seventh overlapping region, so that the first electrode of the seventh transistor may be coupled to the compensation functional pattern 401 through the via-hole. In addition, because the compensation functional pattern 401 is coupled to the initialization signal line, it is able for the first electrode of the seventh transistor to be indirectly coupled to the initialization signal line through the compensation functional pattern 401.

In the embodiments of the present disclosure, the first electrode of the seventh transistor may be indirectly coupled to the initialization signal line through the compensation functional pattern 401, so it is unnecessary to provide a dedicated conductive connection member for coupling the first electrode of the seventh transistor to the initialization signal line, thereby to simplify the manufacture process of the display panel and reduce the manufacture cost thereof.

Figure 19:
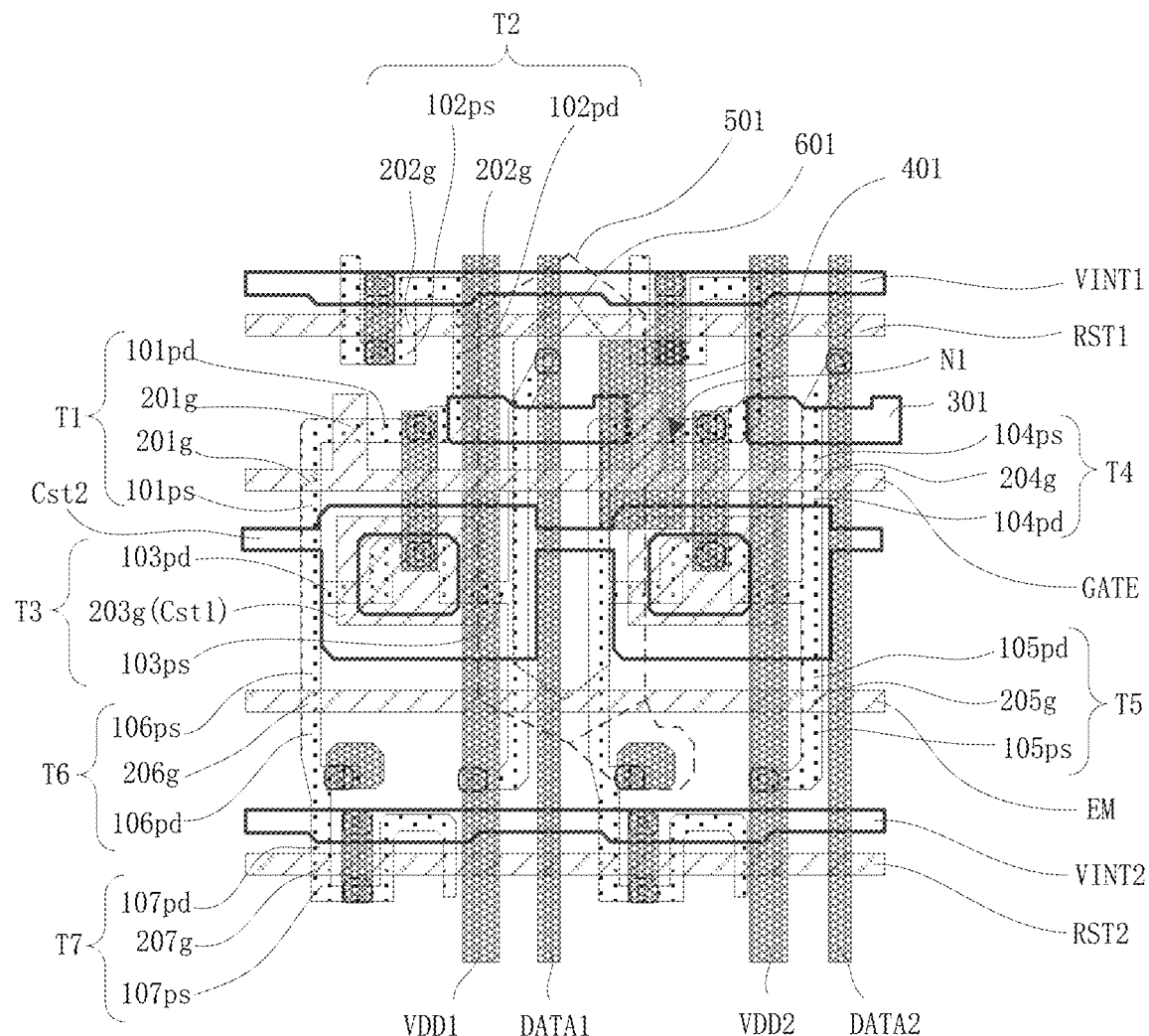
FIG. 19 is a third arrangement schematic view showing the subpixel driving circuitry in the display panel according to an embodiment of the present disclosure.

It should be appreciated that, as shown in FIG. 15, the orthogonal projection of the compensation functional pattern 401 onto the base 50 may overlap the orthogonal projection of the second electrode of the seventh transistor onto the base 50, or as shown in FIG. 19, the orthogonal projection of the compensation functional pattern 401 onto the base 50 may not overlap the orthogonal projection of the second electrode of the seventh transistor onto the base 50.

As shown in FIG. 15, in some embodiments of the present disclosure, the orthogonal projection of the gate electrode of the driving transistor onto the base 50 may at least partially overlap the orthogonal projection of the corresponding compensation functional pattern 401 onto the base 50.

To be specific, referring to FIG. 15 again, when the orthogonal projection of the gate electrode of the driving transistor (i.e., the gate electrode 203g of the third transistor T3) onto the base 50 at least partially overlaps the orthogonal projection of the corresponding compensation functional pattern 401 onto the base 50, the compensation functional pattern 401 may cover at least a part of the gate electrode of the driving transistor, so as to shield the gate electrode of the driving transistor and prevent the occurrence of the crosstalk for the driving transistor due to the change in the data signal transmitted on the data line pattern DATA adjacent to the driving transistor, thereby to ensure the stability of the driving transistor.

Referring to FIG. 15 again, in some embodiments of the present disclosure, the orthogonal projection of the gate electrode of the driving transistor onto the base 50 and the orthogonal projection of the corresponding compensation functional pattern 401 onto the base 50 may include a first overlapping portion, and an orthogonal projection of the first overlapping portion onto the base 50 may at least partially overlap the orthogonal projection of the corresponding first anode 501 onto the base 50.

To be specific, based on the above arrangement mode, in the direction perpendicular to the base 50, there may exist a common overlapping region among the gate electrode of the driving transistor, the compensation functional pattern 401 and the first anode 501. In this way, through the compensation functional pattern 401, it is able not only to prevent the occurrence of the crosstalk for the driving transistor due to the change in the data signal transmitted on the data line pattern DATA adjacent to the driving transistor, but also prevent the occurrence of the crosstalk for the driving transistor due to a change in a driving signal transmitted on the first anode 501.

Further, the compensation functional pattern 401 may be arranged between the gate electrode of the driving transistor and the first anode 501, so as to prevent the occurrence of the crosstalk for the driving transistor due to the change in the driving signal transmitted on the first anode 501 in a better manner.

As shown in FIG. 15, in some embodiments of the present disclosure, the first electrode plate Cst1 of the storage capacitor Cst may be made of a same material as the gate scanning line pattern GATE and the resetting signal line pattern RST, and the second electrode plate Cst2 of the storage capacitor Cst may be made of a same material as the initialization signal line pattern VINT. The orthogonal projection of the first electrode plate Cst1 of the storage capacitor Cst onto the base 50 and the orthogonal projection of the second electrode plate Cst2 of the storage capacitor Cst onto the base 50 may be each arranged between an orthogonal projection of the corresponding gate scanning line pattern GATE onto the base 50 and the orthogonal projection of the corresponding light-emission control signal line pattern EM onto the base 50.

To be specific, during the formation of the functional patterns of the display panel, parts of the functional patterns may be made of a same material. For example, parts of the functional patterns with conductivity may be made of a same conductive material, and parts of the functional patterns with insulativity may be made of a same insulating material.

More specifically, the first electrode plate Cst1 of the storage capacitor may be made of a same material as the gate scanning line pattern GATE and the resetting signal line pattern RST, and the second electrode Cst2 of the storage capacitor may be made of a same material as the initialization signal line pattern VINT. In this arrangement mode, it is able to form the first electrode plate Cst1 of the storage capacitor Cst, the gate scanning line pattern GATE and the resetting signal line pattern RST in a same manufacture environment using a same device. Identically, it is able to form the second electrode plate Cst2 of the storage capacitor Cst and the initialization signal line pattern VINT in a same manufacture environment using a same device. As a result, it is able to effectively simplify the manufacture process of the display panel and reduce the manufacture cost thereof.

In addition, during the arrangement of the first electrode plate Cst1 and the second electrode plate Cst2 of the storage capacitor Cst, each of the orthogonal projection of the first electrode plate Cst1 of the storage capacitor Cst onto the base 50 and the orthogonal projection of the second electrode plate Cst2 of the storage capacitor Cst onto the base 50 may be arranged between the orthogonal projection of the corresponding gate scanning line pattern GATE onto the base 50 and the orthogonal projection of the corresponding light-emission control signal line pattern onto the base 50. In this arrangement mode, it is able to not only ensure an overlapping area between the first electrode plate Cst1 and the second electrode plate Cst2 of the storage capacitor Cst in the direction perpendicular to the base 50, but also prevent the first electrode plate Cst1 and the second electrode plate Cst2 of the storage capacitor Cst from overlapping the gate scanning line pattern GATE and the light-emission control signal line pattern in the direction perpendicular to the base 50, thereby to prevent the generation of the other parasitic capacitor between the storage capacitor Cst and each of the gate scanning line pattern GATE and the light-emission control signal line pattern EM, and ensure the stability of the subpixel driving circuitry.

In some embodiments of the present disclosure, the functional film layer may further include a gate insulation layer (e.g., GI1 in FIG. 17) and a first insulation layer (e.g., GI2 in FIG. 17) arranged at a side of the gate insulation layer distal to the base 50, the first electrode plate Cst1 of the storage capacitor Cst, the gate scanning line pattern GATE and the resetting signal line pattern RST may be each arranged at a surface of the gate insulation layer distal to the base 50, and the second electrode plate Cst2 of the storage capacitor Cst and the initialization signal line pattern VINT may be each arranged at a surface of the first insulation layer distal to the base 50.

To be specific, the functional film layer may further include the gate insulation layer and the first insulation layer. The gate insulation layer may be used to insulate a gate electrode from an active layer of the TFT, and the first insulation layer may be used to insulate the conductive functional patterns arranged at different layers of the display panel.

During the formation of the functional film layer of the display panel, for example, the first electrode plate Cst1 of the storage capacitor Cst, the gate scanning line pattern GATE and the resetting signal line pattern RST may be arranged at the surface of the gate insulation layer distal to the base 50. In this way, when the first electrode plate Cst1 of the storage capacitor Cst, the gate scanning line pattern GATE and the resetting signal line pattern RST are made of a same material, the first electrode plate Cst1 of the storage capacitor Cst, the gate scanning line pattern GATE and the resetting signal line pattern RST may be formed through a single patterning process.

Identically, the second electrode plate Cst2 of the storage capacitor Cst and the initialization signal line pattern VINT may be arranged at the surface of the first insulation layer distal to the base 50. In this way, when the second electrode plate Cst2 of the storage capacitor Cst and the initialization signal line pattern VINT are made of a same material, the second electrode plate Cst2 of the storage capacitor Cst and the initialization signal line pattern VINT may be formed simultaneously through a single patterning process.

When the functional film layer of the display panel is formed as mentioned hereinabove, it is able to save the layout space and reduce the thickness of the display panel. In addition, it is able to effectively simplify the manufacture process of the display panel and reduce the manufacture cost thereof.

As shown in FIG. 15, in some embodiments of the present disclosure, each of the orthogonal projection of the first electrode plate Cst1 of the storage capacitor Cst onto the base 50 and the orthogonal projection of the second electrode plate Cst2 of the storage capacitor Cst onto the base 50 may partially overlap the orthogonal projection of the corresponding first anode 501 onto the base 50.

To be specific, during the arrangement of the first electrode plate Cst1 and the second electrode plate Cst2 of the storage capacitor Cst, for example, each of the orthogonal projection of the first electrode plate Cst1 of the storage capacitor Cst onto the base 50 and the orthogonal projection of the second electrode plate Cst2 of the storage capacitor Cst onto the base 50 may partially overlap the orthogonal projection of the corresponding first anode 501 onto the base 50. Because the first anode 501 is arranged at a layer different from each of the first electrode plate Cst1 and the second electrode plate Cst2 of the storage capacitor Cst, in this arrangement mode, it is able to utilize the layout space of the display panel to a greater extent while preventing the occurrence of the short circuit between the first anode 501 and each of the first electrode plate Cst1 and the second electrode plate Cst2 of the storage capacitor Cst.

As shown in FIG. 15, in some embodiments of the present disclosure, each of the orthogonal projection of the first electrode plate Cst1 of the storage capacitor Cst onto the base 50 and the orthogonal projection of the second electrode plate Cst2 of the storage capacitor Cst onto the base 50 may partially overlap the orthogonal projection of the corresponding compensation functional pattern 401 onto the base 50.

To be specific, referring to FIG. 15 again, when the orthogonal projection of the compensation functional pattern 401 onto the base 50 at least partially overlaps each of the orthogonal projection of the first electrode plate Cst1 of the storage capacitor Cst onto the base 50 and the orthogonal projection of the second electrode plate Cst2 of the storage capacitor Cst onto the base 50, the compensation functional pattern 401 may cover at least a part of the first electrode plate Cst1 and at least a part of the second electrode plate Cst2 of the storage capacitor Cst. In this way, through the compensation functional pattern, it is able to not only prevent the occurrence of the crosstalk for the storage capacitor Cst due to the change in the data signal transmitted on the data line pattern DATA adjacent to the storage capacitor Cst, but also prevent the occurrence of the crosstalk for the storage capacitor Cst due to the change in the driving signal transmitted on the first anode 501, thereby to ensure the stability of the subpixel driving circuitry in the display panel in a better manner.

As shown in FIGS. 13 and 15, in some embodiments of the present disclosure, the second electrode plate Cst2 of the storage capacitor Cst may be provided with an opening 302 at a central region, and an orthogonal projection of the opening 302 onto the base 50 may not overlap the orthogonal projection of the corresponding compensation functional pattern 401 onto the base 50.

To be specific, usually a via-hole and a conductive member passing through the via-hole may be formed at a region where the opening 302 in the first electrode plate Cst2 of the storage capacitor Cst is located, and the functional patterns on and under the second electrode plate may be coupled to each other through the conductive member passing through the via-hole.

In the above-mentioned display panel, when the orthogonal projection of the opening 302 onto the base 50 does not overlap the orthogonal projection of the corresponding compensation functional pattern 401 onto the base 50, it is able to prevent the occurrence of the short circuit between the compensation functional pattern 401 and the conductive member at the opening 302 in a better manner, thereby to ensure the stability of the subpixel driving circuitry in the display panel in a better manner.

It should be appreciated that, in the case that the layout space is limited, the orthogonal projection of the opening 302 onto the base 50 may partially overlap the orthogonal projection of the corresponding compensation functional pattern 401 onto the base 50, as long as no short circuit occurs between the compensation functional pattern 401 and the conductive member at the opening 302.

Figure 18:
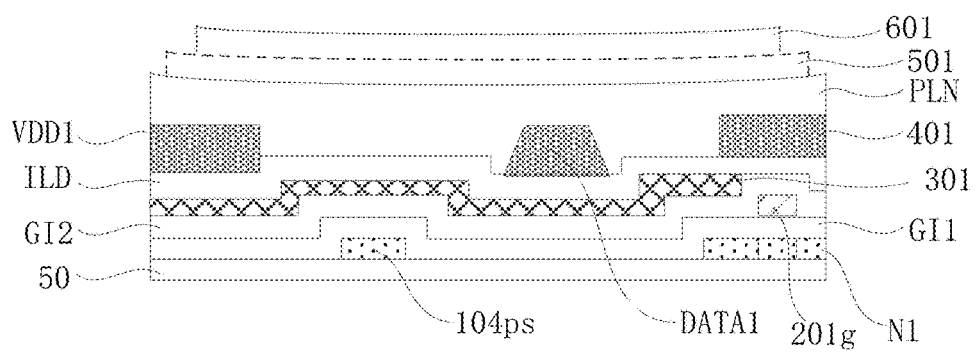
FIG. 18 is a sectional view along a line C1C2 in FIG. 15.
Figure 20:
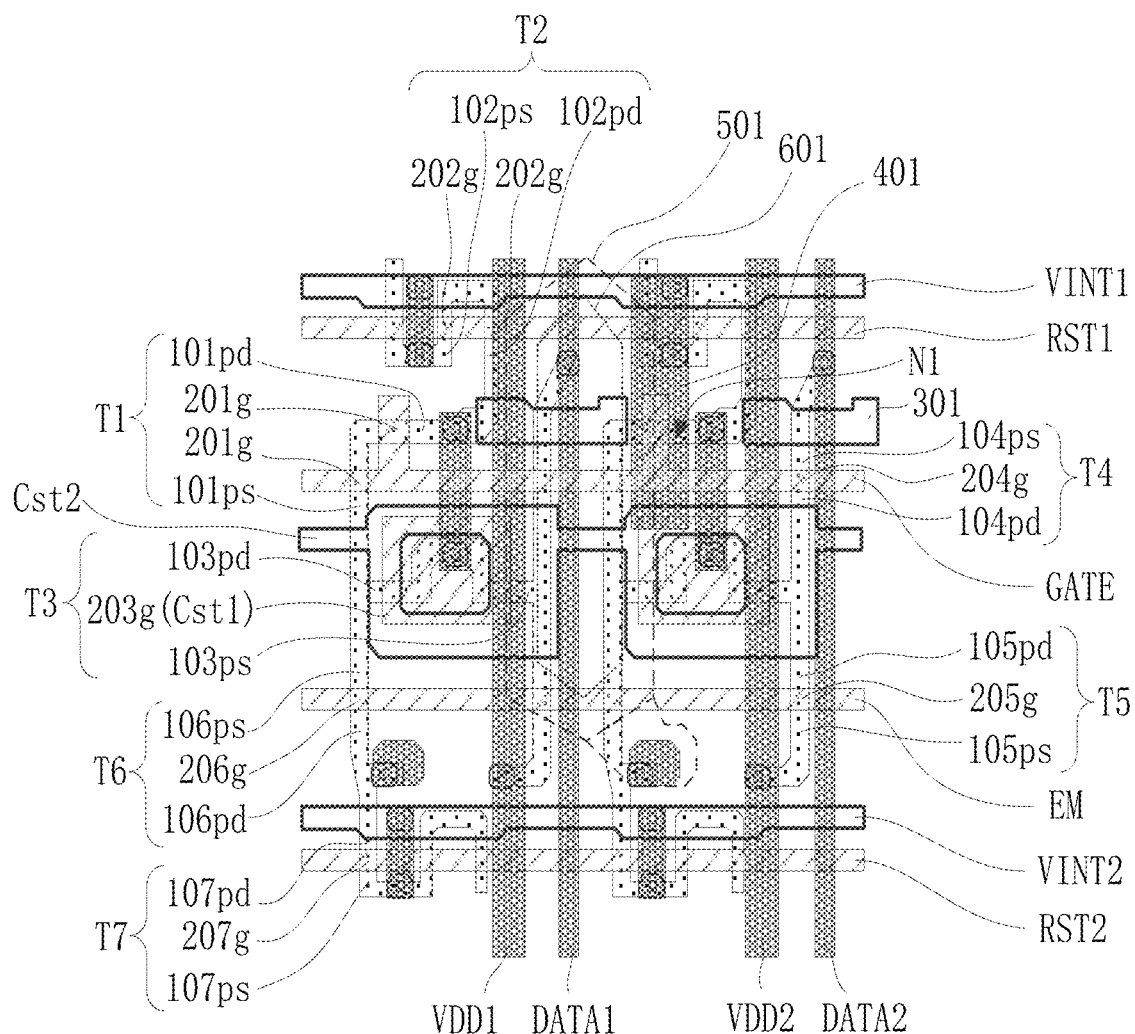
FIG. 20 is a fourth arrangement schematic view showing the subpixel driving circuitry in the display panel according to an embodiment of the present disclosure.

As shown in FIGS. 15 and 18, in some embodiments of the present disclosure, the orthogonal projection of the compensation functional pattern 401 onto the base 50 may partially overlap an orthogonal projection of the shielding pattern 301 onto the base, or as shown in FIG. 20, in some embodiments of the present disclosure, the orthogonal projection of the compensation functional pattern 401 onto the base 50 may not overlap the orthogonal projection of the shielding pattern 301 onto the base.

In some embodiments of the present disclosure, in the direction perpendicular to the base 50, a difference between a thickness of the compensation functional layer and a thickness of the power source signal line layer may be within a threshold range, or a difference between the thickness of the compensation functional layer and a thickness of the data line layer may be within a threshold range.

To be specific, during the formation of the compensation functional pattern 401, the thickness of the compensation functional pattern 401 in the direction perpendicular to the base 50 may be set according to the practical need. For example, in the direction perpendicular to the base 50, the difference between the thickness of the compensation functional layer and the thickness of the power source signal line layer may be within the threshold range, or the difference between the thickness of the compensation functional layer and the thickness of the data line layer may be within the threshold range. In this way, it is able for the compensation functional layer to compensate for a segment difference generated by the power source signal line layer and the data line layer in a better manner.

It should be appreciated that, the threshold range may be smaller than or equal to 0.1 µm. In this way, in the direction perpendicular to the base 50, the thicknesses of the compensation functional layer, the power source signal line layer and the data line layer may approach to each other, so as to ensure a compensation effect of the segment difference in a better manner.

Figure 26:
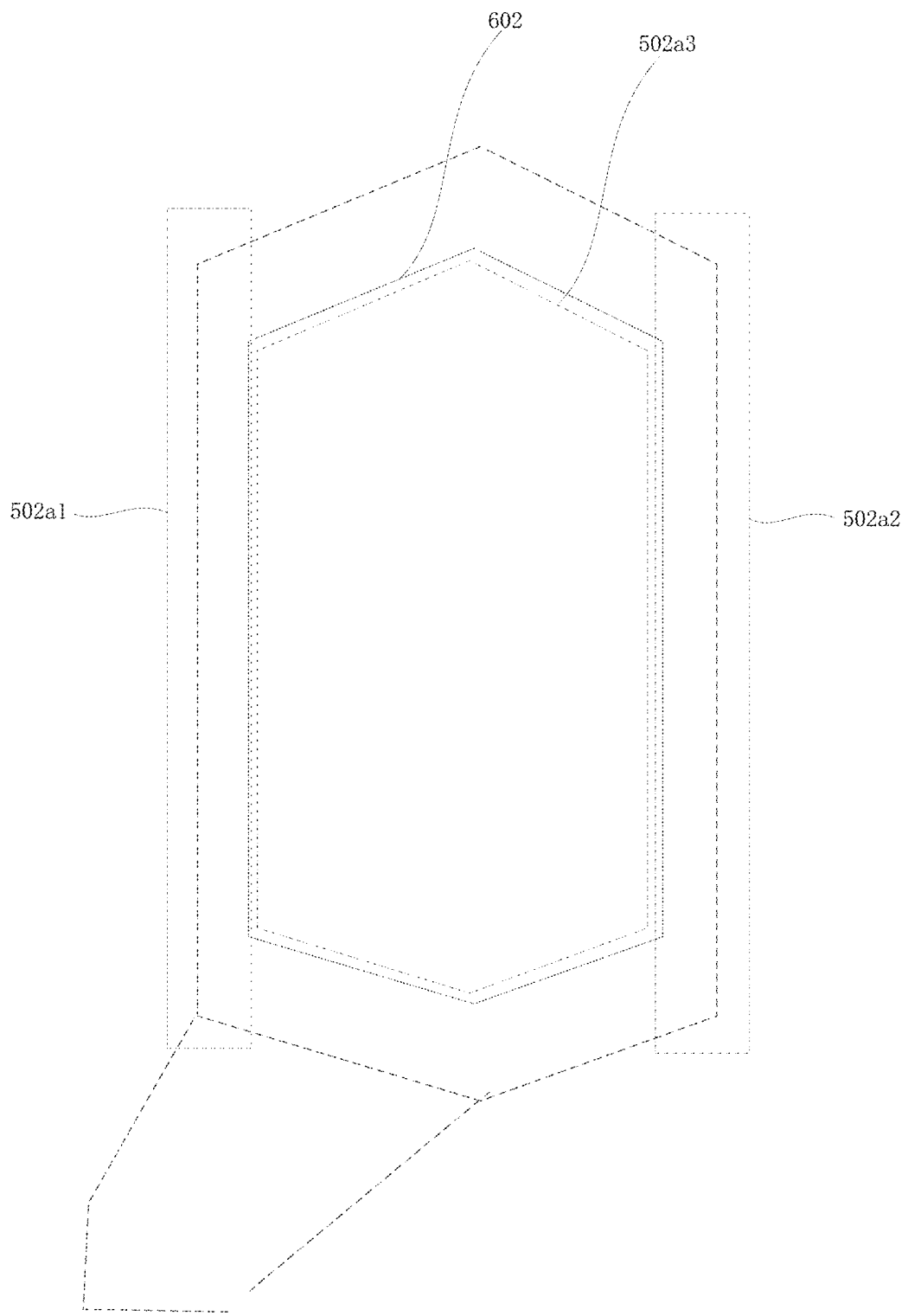
FIG. 26 is a structure schematic view showing a second anode according to an embodiment of the present disclosure.

As shown in FIGS. 24 and 26, in some embodiments of the present disclosure, the display panel may further include a plurality of second light-emitting elements. Each second light-emitting element may include a second anode 502, a second light-emitting pattern 602 and a second cathode sequentially laminated in the direction away from the base 50, the second anode 502 may include a fifth edge portion 502a1, a sixth edge portion 502a2 arranged opposite to the fifth edge portion 502a1 in the second direction, and a second intermediate portion 502a3 arranged between the fifth edge portion 502a1 and the sixth edge portion 502a2, and an orthogonal projection of the second intermediate portion 502a3 onto the base 50 may coincide with an orthogonal projection of the second light-emitting pattern 602 onto the base 50. The orthogonal projection of the second intermediate portion 502a3 onto the base 50 may at least partially overlap the orthogonal projection of the corresponding power source signal line pattern VDD onto the base 50, and at least partially overlap the orthogonal projection of the corresponding data line pattern DATA onto the base 50.

To be specific, the display panel may further includes the second light-emitting element, and the second light-emitting element may emit light in a color different from the first light-emitting element. The second light-emitting element may include the second anode 502, the second light-emitting pattern 602 and the second cathode sequentially laminated in the direction away from the base 50. The second anode 502 may be coupled to a corresponding second subpixel driving circuitry of the display panel, and configured to receive a driving signal provided by the second subpixel driving circuitry. The second cathode is configured to receive a common signal. Under the effect of both the second anode 502 and the second cathode, the second light-emitting pattern 602 may emit light in a corresponding color.

The second anode 502 may be of various structures. For example, the second anode 502 may include the fifth edge portion 502a1, the sixth edge portion 502a2 arranged opposite to the fifth edge portion 502a1 in the second direction, and the second intermediate portion 502a3 arranged between the fifth edge portion 502a1 and the sixth edge portion 502a2.

During the formation of the second light-emitting element, the orthogonal projection of the second intermediate portion 502a3 onto the base 50 may coincide with the orthogonal projection of the second light-emitting pattern 602 onto the base 50, the orthogonal projection of the second intermediate portion 502a3 onto the base 50 may at least partially overlap the orthogonal projection of the corresponding power source signal line pattern VDD onto the base 50, and the orthogonal projection of the second intermediate portion 502a3 onto the base 50 may at least partially overlap the orthogonal projection of the corresponding data line pattern DATA onto the base 50. In this arrangement mode, the intermediate portion of the second anode 502 may evenly cover the power source signal line pattern VDD and the data line pattern DATA, so the intermediate portion of the second anode 502 may be provided with relatively high flatness. As a result, when the second light-emitting pattern 602 is formed on the second intermediate portion 502a3 of the second anode 502, it is able to provide the second light-emitting element with relatively high flatness, thereby to ensure a luminous effect of the second light-emitting element and relieve the color cast during the displaying process of the display device.

As shown in FIG. 26, in some embodiments of the present disclosure, the second light-emitting pattern 602 may be symmetric relative to a second symmetry axis extending in the first direction, and an orthogonal projection of the second symmetry axis onto the base 50 may be located within the orthogonal projection of the corresponding power source signal line pattern VDD onto the base 50.

To be specific, the structure of the second light-emitting pattern 602 may be set according to the practical need. For example, the second light-emitting pattern 602 may be an axisymmetric pattern, so as to improve the luminous uniformity of the second light-emitting element.

Further, the second light-emitting pattern 602 may be symmetric relative to the second symmetry axis extending in the first direction, and the orthogonal projection of the second symmetry axis onto the base 50 may be located within the orthogonal projection of the corresponding power source signal line pattern VDD onto the base 50. In this arrangement mode, a central portion of the second light-emitting pattern 602 may cover the power source signal line pattern VDD. In addition, because the power source signal line pattern VDD extends in the first direction and has a relatively large width in a direction perpendicular to the first direction, a majority of the second light-emitting pattern 602 may be formed on the power source signal line pattern VDD, so as to ensure the flatness of the second light-emitting pattern 602 and relieve the color cast during the displaying process of the display panel in a better manner.

Figure 27:
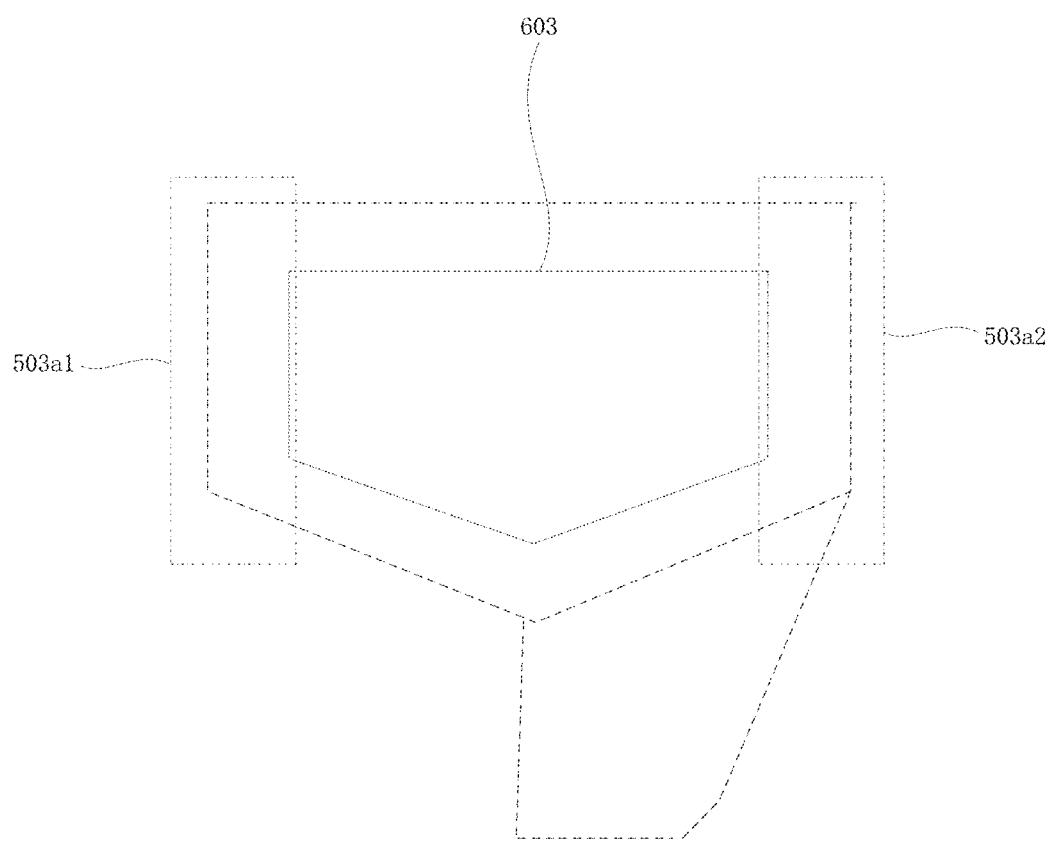
FIG. 27 is a structure schematic view showing a third anode according to an embodiment of the present disclosure.

As shown in FIGS. 24 and 27, in some embodiments of the present disclosure, the display panel may further include a plurality of third light-emitting elements, each third light-emitting element may include two light-emitting sub-elements arranged opposite to each other in the first direction, each light-emitting sub-element may include a third anode 503, a third light-emitting pattern 603 and a third cathode sequentially laminated in the direction away from the base 50, the third anode 503 may include a seventh edge portion 503a1, an eighth edge portion 503a2 arranged opposite to the seventh edge portion 503a1 in the second direction, and a third intermediate portion arranged between the seventh edge portion 503a1 and the eighth edge portion 503a2, and an orthogonal projection of the third intermediate portion onto the base 50 may coincide with an orthogonal projection of the third light-emitting pattern 603 onto the base 50. The orthogonal projection of the third intermediate portion onto the base 50 may at least partially overlap the orthogonal projection of the corresponding data line pattern DATA onto the base 50, and an orthogonal projection of the seventh edge portion 503a1 onto the base 50 may at least partially overlap the orthogonal projection of the corresponding power source signal line pattern VDD onto the base 50.

To be specific, the display panel may further include the plurality of third light-emitting elements, and each third light-emitting element may include two light-emitting sub-elements arranged opposite to each other in the first direction. Each light-emitting sub-element may emit light in a color different from each of the first light-emitting element and the second light-emitting element. The light-emitting sub-element may include the third anode 503, the third light-emitting pattern 603 and the third cathode sequentially laminated in the direction away from the base 50. The third anode 503 may be coupled to a corresponding third subpixel driving circuitry of the display panel, and configured to receive a driving signal provided by the third subpixel driving circuitry. The third cathode is configured to receive a common signal. Under the effect of both the third anode 503 and the third cathode, the third light-emitting pattern 603 may emit light in a corresponding color.

The third anode 503 may be of various structures. For example, the third anode 503 may include the seventh edge portion and the eighth edge portion arranged opposite to each other in the second direction, and the third intermediate portion between the seventh edge portion and the eighth edge portion.

During the arrangement of the third light-emitting element, the orthogonal projection of the third intermediate portion onto the base 50 may coincide with the orthogonal projection of the third light-emitting pattern 603 onto the base 50, and the orthogonal projection of the third intermediate portion onto the base 50 may at least partially overlap the orthogonal projection of the corresponding data line pattern DATA onto the base 50. The orthogonal projection of the seventh edge portion onto the base 50 may at least partially overlap the orthogonal projection of the corresponding power source signal line pattern VDD onto the base 50. In this arrangement mode, an overlapping area between the third anode 503 and each of the corresponding power source signal line pattern VDD and the data line pattern DATA may be relatively small, so as to provide the third light-emitting pattern 603 with relatively high flatness, thereby to ensure a luminous effect of the third light-emitting element and relieve the color cast during the displaying process of the display panel.

In some embodiments of the present disclosure, the first light-emitting element may include a red subpixel, the second light-emitting element may include a blue subpixel, and the third light-emitting element may include a green subpixel.

To be specific, the colors of the light emitted by the first light-emitting element, the second light-emitting element and the third light-emitting element may be set according to the practical need. For example, the first light-emitting element may include a red subpixel, the second light-emitting element may include a blue subpixel, and the third light-emitting element may include a green subpixel.

The present disclosure further provides in some embodiments a display device including the above-mentioned display panel.

In the display panel of the above embodiments of the present disclosure, through the compensation functional pattern 401, it is able to compensate for the segment difference generated by the power source signal line pattern VDD and the data line pattern DATA under the first anode 501. Hence, in the display panel, when a part of the corresponding power source signal line pattern VDD, a part of the corresponding data line pattern DATA and at least a part of the corresponding compensation functional pattern 401 are covered by the first anode 501 of the first light-emitting element simultaneously, it is able to provide the first anode 401 with relatively high flatness, thereby to effectively prevent the occurrence of the color cast for the display panel during the displaying process. As a result, when the display device includes the display panel, the display device may also have the above-mentioned beneficial effects.

It should be appreciated that, the display device may be any product or member having a display function, e.g., television, display, digital photo frame, mobile phone or flat-panel computer.

The present disclosure further provides in some embodiments a method for manufacturing a display panel. The display panel includes a plurality of subpixel regions arranged in an array form. The method includes: forming a functional film layer on a base 50, the functional film layer including a power source signal line layer, a data line layer and a compensation functional layer, the power source signal line layer including a power source signal line pattern VDD arranged at each subpixel region, the data line layer including a data line pattern DATA arranged at each subpixel region, the power source signal line pattern VDD including a first portion extending in a first direction, the data line pattern DATA extending in the first direction, and the compensation functional layer including a compensation functional pattern 401 arranged at at least one subpixel region; and forming a plurality of first light-emitting elements at a side of the functional film layer distal to the base 50, each first light-emitting element including a first anode 501, a first light-emitting pattern 601 and a first cathode sequentially laminated in a direction away from the base. An orthogonal projection of the first anode 501 onto the base 50 overlaps an orthogonal projection of a corresponding power source signal line pattern VDD onto the base 50 at a first overlapping region F1, overlaps an orthogonal projection of a corresponding data line pattern DATA onto the base 50 at a second overlapping region F2, and overlaps an orthogonal projection of a corresponding compensation functional pattern 401 onto the base 50 at a third overlapping region F3. The second overlapping region F2 is arranged between the first overlapping region F1 and the third overlapping region F3.

To be specific, the plurality of subpixel regions arranged in an array form may include subpixel regions arranged in columns and extending in the first direction, and subpixel regions arranged in rows and extending in a second direction. The subpixel regions in columns may include a plurality of subpixel regions arranged in the first direction, and the subpixel regions in rows may include a plurality of subpixel regions arranged in the second direction crossing the first direction. Illustratively, the first direction may include a direction Y, and the second direction may include a direction X.

The power source signal line layer may include a power source signal line pattern VDD arranged at each subpixel region. In a possible embodiment of the present disclosure, the power source signal line pattern VDD may optionally be of a grid-like structure, and the grid-like power source signal line pattern VDD may include the first portion extending in the first direction. The power source signal line patterns VDD may correspond to the subpixel regions in columns respectively, and the power source signal line pattern VDD may be arranged at subpixel regions in a corresponding column.

The data line layer may include a data line pattern DATA arranged at each subpixel region and extending in the first direction. The data line patterns DATA may correspond to the subpixel regions in columns respectively, and the data line pattern DATA may be arranged at subpixel regions in a corresponding column.

The display panel may further includes the plurality of first light-emitting elements arranged at a side of the functional film layer distal to the base 50. Each first light-emitting element may include the first anode 501, the first light-emitting pattern 601 and the first cathode sequentially laminated in the direction away from the base 50. During the operation of the display panel, a driving signal may be applied to the first anode 501, and a common signal may be applied to the first cathode, so as to generate an electric field between the first anode 501 and the first cathode, thereby to control the first light-emitting pattern 601 to emit light in a corresponding color. Illustratively, the first light-emitting element may include a red light-emitting element capable of emitting red light.

The compensation functional layer may include the compensation functional pattern 401 arranged at at least one subpixel region. Illustratively, the compensation functional patterns 401 may correspond to the first light-emitting elements respectively.

During the formation of the display panel, the functional film layer may be formed on the base 50 at first, and then the first light-emitting elements may be formed at a side of the functional film layer distal to the base 50. During the formation of the functional film layer, the power source signal line patterns VDD and the data line patterns DATA may be arranged alternately in the second direction, and the compensation functional pattern 401 may be arranged in proximity to the corresponding first light-emitting element. Illustratively, the orthogonal projection of the first anode 501 of each first light-emitting element onto the base 50 may overlap the orthogonal projection of the corresponding power source signal line pattern VDD onto the base 50 at the first overlapping region F1, overlap the orthogonal projection of the corresponding data line pattern DATA onto the base 50 at the second overlapping region F2, and overlap the orthogonal projection of the corresponding compensation functional pattern 401 onto the base 50 at the third overlapping region F3. The second overlapping region F2 may be arranged between the first overlapping region F1 and the third overlapping region F3.

In the display panel manufactured using the above-mentioned method, the compensation functional pattern 401 may compensate for a segment difference generated by the power source signal line pattern VDD and the data line pattern DATA under the first anode 501. Hence, in the display panel, when a part of the corresponding power source signal line pattern VDD, a part of the corresponding data line pattern DATA and a part of the corresponding compensation functional pattern 401 are covered by the first anode 501 of the first light-emitting element simultaneously, it is able to provide the first anode 401 with relatively high flatness, thereby to effectively prevent the occurrence of the color cast for the display panel during the displaying process of the display panel.

It should be further appreciated that, the above embodiments have been described in a progressive manner, and the same or similar contents in the embodiments have not been repeated, i.e., each embodiment has merely focus on the difference from the others. Especially, the method embodiments are substantially similar to and may refer to the product embodiments, and thus have been described in a simple manner.

Unless otherwise defined, any technical or scientific term used herein shall have the common meaning understood by a person skilled in the art. Such words as "first" and "second" used in the present disclosure are merely used to differentiate different components rather than to represent any order, number or importance. Similarly, such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship may be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the specific features, structures, materials or characteristics may be combined in any one or more embodiments or examples in an appropriate manner.

The above embodiments are for illustrative purposes only, but the present disclosure is not limited thereto. A person skilled in the art may make further modifications and substitutions without departing from the principle of the present disclosure, and these modifications and substitutions shall also fall within the protection scope of the present disclosure. Therefore, the protection scope of the present disclosure shall be defined by claims.

What is claimed is:

1. A display panel, comprising a base, a functional film layer arranged on the base, a plurality of first light-emitting elements arranged at a side of the functional film layer distal to the base, and a plurality of subpixel regions arranged in an array form, wherein
the functional film layer comprises a power source signal line layer, a data line layer and a compensation functional layer, the power source signal line layer comprises a power source signal line pattern arranged at each subpixel region, the data line layer comprises a data line pattern arranged at each subpixel region, the power source signal line pattern comprises a first portion extending in a first direction, the data line pattern extends in the first direction, and the compensation functional layer comprises a compensation functional pattern arranged at at least one subpixel region;
each of the first light-emitting elements comprises a first anode, a first light-emitting pattern and a first cathode sequentially laminated in a direction away from the base; an orthogonal projection of the first anode onto the base overlaps an orthogonal projection of a corresponding power source signal line pattern onto the base at a first overlapping region, the orthogonal projection of the first anode onto the base overlaps an orthogonal projection of a corresponding data line pattern onto the base at a second overlapping region, and the orthogonal projection of the first anode onto the base overlaps an orthogonal projection of a corresponding compensation functional pattern onto the base at a third overlapping region; and the second overlapping region is arranged between the first overlapping region and the third overlapping region, wherein in a direction perpendicular to the base, a difference between a thickness of the compensation functional layer and a thickness of the power source signal line layer is within a threshold range, or a difference between the thickness of the compensation functional layer and a thickness of the data line layer is within a threshold range.

2. The display panel according to claim 1, wherein the first anode comprises a first edge portion and a second edge portion arranged opposite to each other in a second direction crossing the first direction, and a first intermediate portion arranged between the first edge portion and the second edge portion; and an orthogonal projection of the first edge portion onto the base comprises the first overlapping region, an orthogonal projection of the second edge portion onto the base comprises the third overlapping region, and an orthogonal projection of the first intermediate portion onto the base comprises the second overlapping region.

3. The display panel according to claim 2, wherein the functional film layer further comprise a gate scanning line layer, an initialization signal line layer, a resetting signal line layer and a light-emission control signal line layer, the gate scanning line layer comprises a gate scanning line pattern arranged at each subpixel region, the initialization signal line layer comprises an initialization signal line pattern arranged at each subpixel region, the resetting signal line layer comprises a resetting signal line pattern arranged at each subpixel region, the light-emission control signal line layer comprises a light-emission control signal line pattern arranged at each subpixel region, and the gate scanning line pattern, the initialization signal line pattern, the resetting signal line pattern and the light-emission control signal line pattern extend in a second direction crossing the first direction.

4. The display panel according to claim 3, wherein
the first anode further comprises a third edge portion and a fourth edge portion arranged opposite to each other in the first direction, the first intermediate portion is arranged between the third edge portion and the fourth edge portion, the third edge portion is coupled to the first edge portion and the second edge portion, the fourth edge portion is coupled to the first edge portion and the second edge portion;

the orthogonal projection of the first intermediate portion onto the base overlaps an orthogonal projection of a corresponding gate scanning line pattern onto the base and an orthogonal projection of a corresponding resetting signal line pattern onto the base at a sixth overlapping region.

5. The display panel according to claim 4, wherein the first anode comprises a body portion and a via-hole connection portion, the body portion comprises the first edge portion, the second edge portion, the third edge portion, the fourth edge portion and the first intermediate portion, and the body portion is a centrosymmetric pattern.

6. The display panel according to claim 2, wherein the first intermediate portion is a centrosymmetric pattern, and the orthogonal projection of the first intermediate portion onto the base coincides with the orthogonal projection of the first light-emitting pattern onto the base.

7. The display panel according to claim 3, wherein the display panel comprises a first metal layer, a second metal layer and a third metal layer;

the gate scanning line layer, the resetting signal line layer and the light-emission control signal line layer are arranged in the first metal layer;

the initialization signal line layer is arranged in the second metal layer;

the data line layer, the power source signal line layer and the compensation functional layer are arranged in the third metal layer;

the functional film layer further comprises a first insulation layer and a second insulation layer, the first insulation layer is arranged between the first metal layer and the second metal layer, and the second insulation layer is arranged between the second metal layer and the third metal layer.

8. The display panel according to claim 3, wherein the compensation functional pattern is made of a conductive material and coupled to the initialization signal line pattern.

9. The display panel according to claim 8, wherein the compensation functional pattern and the data line pattern are arranged in a same layer.

10. The display panel according to claim 3, further comprising a plurality of subpixel driving circuitries, wherein a first part of the subpixel driving circuitries correspond to the first light-emitting elements respectively, each of the first part of the subpixel driving circuitries is configured to drive a corresponding first light-emitting element to emit light; the subpixel driving circuitry comprises a driving transistor, a first transistor, a second transistor, a fourth transistor and a storage capacitor;

a gate electrode of the first transistor is coupled to a corresponding gate scanning line pattern, a first electrode of the first transistor is coupled to a second electrode of the driving transistor, and a second electrode of the first transistor is coupled to a gate electrode of the driving transistor;

a gate electrode of the second transistor is coupled to a corresponding resetting signal line pattern, a first electrode of the second transistor is coupled to a corresponding initialization signal line pattern, and a second electrode of the second transistor is coupled to the gate electrode of the driving transistor;

a gate electrode of the fourth transistor is coupled to the corresponding gate scanning line pattern, a first electrode of the fourth transistor is coupled to a corresponding data line pattern, and a second electrode of the fourth transistor is coupled to a first electrode of the driving transistor;

the first electrode of the driving transistor is coupled to a corresponding power source signal line pattern, and the second electrode of the driving transistor is coupled to a corresponding first light-emitting element;

a first electrode plate of the storage capacitor is coupled to the gate electrode of the driving transistor, and a second electrode plate of the storage capacitor is coupled to the corresponding power source signal line pattern.

11. The display panel according to claim 10, wherein the subpixel driving circuitry further comprises a first conductive connection member, the second electrode of the first transistor is coupled to the gate electrode of the driving transistor through the first conductive connection member;

the display panel further comprises a third metal layer, the first conductive connection member is arranged at the third metal layer, and an orthogonal projection of the first conductive connection member in the first part of the subpixel driving circuitries onto the base does not overlap the orthogonal projection of the first anode corresponding to the first conductive connection member onto the base.

12. The display panel according to claim 11, further comprising a plurality of second light-emitting elements and a plurality of third light-emitting elements, wherein each of the second light-emitting elements comprises a second anode, a second light-emitting pattern and a second cathode sequentially laminated in the direction away from the base, each of the third light-emitting elements comprises two light-emitting sub-elements arranged opposite to each other in the first direction, and each of the light-emitting sub-elements comprises a third anode, a third light-emitting pattern and a third cathode sequentially laminated in the direction away from the base;

the plurality of subpixel driving circuitries further comprises a second part of the subpixel driving circuitries and a third part of the subpixel driving circuitries, the second part of the subpixel driving circuitries correspond to the second light-emitting elements respectively, each of the second part of the subpixel driving circuitries is configured to drive a corresponding second light-emitting element to emit light, the third part of the subpixel driving circuitries correspond to the light-emitting sub-elements respectively, and each of the third part of the subpixel driving circuitries is configured to drive a corresponding light-emitting sub-element to emit light;

the orthogonal projection of the first conductive connection member in the second part of the subpixel driving circuitries onto the base overlaps an orthogonal projection of a second anode corresponding to the first conductive connection member onto the electrode, and the orthogonal projection of the first conductive connection member in the third part of the subpixel driving circuitries onto the base overlaps an orthogonal projection of a third anode corresponding to the first conductive connection member onto the base.

13. The display panel according to claim 10, wherein the gate electrode of the first transistor is in direct contact with the corresponding gate scanning line pattern.

14. The display panel according to claim 10, wherein an orthogonal projection of the first electrode of the first transistor onto the base does not overlap an orthogonal projection of a corresponding compensation functional pattern onto the base.

15. The display panel according to claim 10, wherein an orthogonal projection of the second electrode of the first transistor onto the base does not overlap the orthogonal projection of the corresponding compensation functional pattern onto the base.

16. The display panel according to claim 10, wherein the subpixel driving circuitry further comprises a seventh transistor, a gate electrode of the seventh transistor is coupled to the resetting signal line pattern, a second electrode of the seventh transistor in the first part of the subpixel driving circuitries is coupled to the first anode, an orthogonal projection of the first electrode of the seventh transistor onto the base overlaps the orthogonal projection of the corresponding compensation functional pattern onto the base at a seventh overlapping region, and the first electrode of the seventh transistor is coupled to the corresponding compensating functional pattern through a via-hole in the seventh overlapping region, to be indirectly coupled to a corresponding initialization signal line pattern through the compensation functional pattern.

17. The display panel according to claim 10, wherein the functional film layer further comprises a gate insulation layer and a first insulation layer arranged at a side of the gate insulation layer distal to the base; the first electrode plate of the storage capacitor, the gate scanning line pattern and the resetting signal line pattern are each arranged at a surface of the gate insulation layer distal to the base; and the second electrode plate of the storage capacitor and the initialization signal line pattern are each arranged at a surface of the first insulation layer distal to the base.

18. The display panel according to claim 10, wherein each of the orthogonal projection of the first electrode plate of the storage capacitor onto the base and the orthogonal projection of the second electrode plate of the storage capacitor onto the base partially overlaps the orthogonal projection of the corresponding first anode onto the base.

19. The display panel according to claim 1, wherein the display panel further comprises a plurality of second light-emitting elements;

each of the second light-emitting elements comprises a second anode, a second light-emitting pattern and a second cathode sequentially laminated in the direction away from the base, the second anode comprises a fifth edge portion and a sixth edge portion arranged opposite to each other in the second direction, and a second intermediate portion arranged between the fifth edge portion and the sixth edge portion, and an orthogonal projection of the second intermediate portion onto the base coincides with an orthogonal projection of the second light-emitting pattern onto the base;

the orthogonal projection of the second intermediate portion onto the base at least partially overlaps the orthogonal projection of the corresponding power source signal line pattern onto the base, and the orthogonal projection of the second intermediate portion onto the base at least partially overlaps the orthogonal projection of the corresponding data line pattern onto the base, wherein the second light-emitting pattern is symmetric relative to a second symmetry axis extending in the first direction, and an orthogonal projection of the second symmetry axis onto the base is located within the orthogonal projection of the corresponding power source signal line pattern onto the base.

20. The display panel according to claim 1, wherein the display panel further comprises a plurality of second light-emitting elements;

each of the second light-emitting elements comprises a second anode, a second light-emitting pattern and a second cathode sequentially laminated in the direction away from the base, the second anode comprises a fifth edge portion and a sixth edge portion arranged opposite to each other in the second direction, and a second intermediate portion arranged between the fifth edge portion and the sixth edge portion, and an orthogonal projection of the second intermediate portion onto the base coincides with an orthogonal projection of the second light-emitting pattern onto the base;

the orthogonal projection of the second intermediate portion onto the base at least partially overlaps the orthogonal projection of the corresponding power source signal line pattern onto the base, and the orthogonal projection of the second intermediate portion onto the base at least partially overlaps the orthogonal projection of the corresponding data line pattern onto the base, wherein the display panel further comprises a plurality of third light-emitting elements;

each of the third light-emitting elements comprises two light-emitting sub-elements arranged opposite to each other in the first direction, each of the light-emitting sub-elements comprises a third anode, a third light-emitting pattern and a third cathode sequentially laminated in the direction away from the base, the third anode comprises a seventh edge portion and an eighth edge portion arranged opposite to each other in the second direction, and a third intermediate portion arranged between the seventh edge portion and the eighth edge portion, and an orthogonal projection of the third intermediate portion onto the base coincides with an orthogonal projection of the third light-emitting pattern onto the base;

the orthogonal projection of the third intermediate portion onto the base at least partially overlaps the orthogonal projection of the corresponding data line pattern onto the base;

an orthogonal projection of the seventh edge portion onto the base at least partially overlaps the orthogonal projection of the corresponding power source signal line pattern onto the base.

21. A display device, comprising the display panel according to claim 1.

22. A method for manufacturing a display panel, the display panel comprising a plurality of subpixel regions arranged in an array form, the method comprising:

forming a functional film layer on a base, the functional film layer comprising a power source signal line layer, a data line layer and a compensation functional layer, the power source signal line layer comprising a power source signal line pattern arranged at each of the subpixel regions, the data line layer comprising a data line pattern arranged at each of the subpixel regions, the power source signal line pattern comprising a first portion extending in a first direction, the data line pattern extending in the first direction, and the compensation functional layer comprising a compensation functional pattern arranged at at least one subpixel region; and forming a plurality of first light-emitting elements at a side of the functional film layer distal to the base, each of the first light-emitting elements comprising a first anode, a first light-emitting pattern and a first cathode sequentially laminated in a direction away from the base, wherein an orthogonal projection of the first anode onto the base overlaps an orthogonal projection of a corresponding power source signal line pattern onto the base at a first overlapping region, overlaps an orthogonal projection of a corresponding data line pattern onto the base at a second overlapping region, and overlaps an orthogonal projection of a corresponding compensation functional pattern onto the base at a third overlapping region, and the second overlapping region is arranged between the first overlapping region and the third overlapping region, wherein in a direction perpendicular to the base, a difference between a thickness of the compensation functional layer and a thickness of the power source signal line layer is within a threshold range, or a difference between the thickness of the compensation functional layer and a thickness of the data line layer is within a threshold range.

* * * * *